US012284901B2

(12) United States Patent
Seo et al.

(10) Patent No.: US 12,284,901 B2
(45) Date of Patent: Apr. 22, 2025

(54) DISPLAY APPARATUS INCLUDING INTERMEDIATE LAYER WITH DIFFERENT THICKNESSES BETWEEN PIXEL ELECTRODES AND METHOD OF MANUFACTURING THE SAME

(71) Applicant: Samsung Display Co., Ltd., Yongin-si (KR)

(72) Inventors: Seokhoon Seo, Yongin-si (KR); Soyeon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 154 days.

(21) Appl. No.: 17/303,027

(22) Filed: May 18, 2021

(65) Prior Publication Data
US 2022/0077434 A1     Mar. 10, 2022

(30) Foreign Application Priority Data

Sep. 4, 2020   (KR) .................. 10-2020-0113215

(51) Int. Cl.
*H01L 51/56*     (2006.01)
*G06F 3/041*     (2006.01)
(Continued)

(52) U.S. Cl.
CPC .......... *H10K 71/00* (2023.02); *G06F 3/0412* (2013.01); *H10K 50/844* (2023.02); *H10K 59/122* (2023.02); *H10K 59/353* (2023.02); *H10K 59/40* (2023.02); *H10K 71/233* (2023.02); *G06F 2203/04103* (2013.01); *H10K 50/15* (2023.02); *H10K 50/16* (2023.02); *H10K 50/17* (2023.02); *H10K 50/171* (2023.02); *H10K 59/1201* (2023.02); *H10K 2102/351* (2023.02)

(58) Field of Classification Search
CPC ....................................... H10K 71/00
See application file for complete search history.

(56) References Cited

U.S. PATENT DOCUMENTS 4,998,151 A * 3/1991 Korman ................ H01L 29/665
257/E21.162
9,484,550 B2   11/2016 Furuie
(Continued)

FOREIGN PATENT DOCUMENTS

| JP | 2011-113733 A | 6/2011 |
|---|---|---|
| JP | 2013-069615 A | 4/2013 |
| JP | 6391917 B2 | 9/2018 |
| KR | 10-1412430 B1 | 6/2014 |
| KR | 10-2019-0013172 A | 2/2019 |
| WO | WO 2019/180878 A1 | 9/2019 |

*Primary Examiner* — Peter Bradford
(74) *Attorney, Agent, or Firm* — Womble Bond Dickinson (US) LLP

(57) ABSTRACT

A display apparatus includes: a first pixel electrode and a second pixel electrode spaced apart from each other on a substrate; a pixel definition layer including an opening exposing a central portion of each of the first pixel electrode and the second pixel electrode; an intermediate layer on the first pixel electrode, the second pixel electrode, and the pixel definition layer and including a through hole exposing at least a portion of an upper surface of the pixel definition layer between the first pixel electrode and the second pixel electrode; an opposite electrode on the intermediate layer to face the first pixel electrode and the second pixel electrode; and an inorganic encapsulation layer over the opposite electrode.

17 Claims, 19 Drawing Sheets

(51) Int. Cl.
    *H01L 27/32*     (2006.01)
    *H01L 51/00*     (2006.01)
    *H01L 51/52*     (2006.01)
    *H10K 50/844*     (2023.01)
    *H10K 59/122*     (2023.01)
    *H10K 59/35*     (2023.01)
    *H10K 59/40*     (2023.01)
    *H10K 71/00*     (2023.01)
    *H10K 71/20*     (2023.01)
    *H10K 50/15*     (2023.01)
    *H10K 50/16*     (2023.01)
    *H10K 50/17*     (2023.01)
    *H10K 59/12*     (2023.01)
    *H10K 102/00*     (2023.01)

(56) References Cited

U.S. PATENT DOCUMENTS

| | | |
|---|---|---|
| 10,541,293 B2 | 1/2020 | Kim |
| 2016/0111684 A1* | 4/2016 | Savas ............... C23C 16/308 |
| | | 438/26 |
| 2017/0117337 A1 | 4/2017 | Kimura et al. |
| 2018/0130972 A1 | 5/2018 | Sonoda et al. |
| 2018/0366524 A1* | 12/2018 | Bang ............... H10K 59/122 |
| 2019/0115561 A1* | 4/2019 | Tang ............... H10K 59/1213 |
| 2019/0165062 A1* | 5/2019 | Heo ............... H10K 59/124 |
| 2019/0189954 A1* | 6/2019 | Naganuma ......... H10K 59/8791 |
| 2020/0343322 A1* | 10/2020 | Jia ............... H10K 71/00 |
| 2021/0020689 A1 | 1/2021 | Okabe et al. |
| 2021/0183972 A1* | 6/2021 | Son ............... H10K 59/122 |
| 2021/0202904 A1* | 7/2021 | Shin ............... H10K 59/122 |

\* cited by examiner

DISPLAY APPARATUS INCLUDING INTERMEDIATE LAYER WITH DIFFERENT THICKNESSES BETWEEN PIXEL ELECTRODES AND METHOD OF MANUFACTURING THE SAME

CROSS-REFERENCE TO RELATED APPLICATION

The present application claims priority to and the benefit of Korean Patent Application No. 10-2020-0113215, filed on Sep. 4, 2020, in the Korean Intellectual Property Office, the disclosure of which is incorporated by reference herein in its entirety.

BACKGROUND

1. Field

Aspects of one or more example embodiments relate to a display apparatus and a method of manufacturing the same, and for example, to a display apparatus having relatively enhanced encapsulation characteristics while having a relatively small thickness and a method of manufacturing the same.

2. Description of Related Art

From among the display apparatuses, organic light emitting display apparatuses have attracted attention as next-generation display apparatuses because they may have relatively wide viewing angles, relatively excellent contrast, and relatively fast response times.

Generally, in an organic light emitting display apparatus, a thin film transistor and an organic light emitting diode as a display device are formed over a substrate and the organic light emitting diode emits light and operates by itself. An encapsulation member may be formed over the organic light emitting diode to encapsulate the organic light emitting diode, thereby preventing or reducing incidences of external moisture and impurities flowing into the organic light emitting diode.

Such an organic light emitting display apparatus may be used as a display unit of a small product such as a mobile phone or may be used as a display unit of a large product such as a television.

The above information disclosed in this Background section is only for enhancement of understanding of the background and therefore the information discussed in this Background section does not necessarily constitute prior art.

SUMMARY

Aspects of one or more example embodiments include a display apparatus having relatively enhanced encapsulation characteristics while having a relatively small thickness and a method of manufacturing the same. However, these problems are merely examples and the scope of embodiments according to the present disclosure are not limited thereto.

Additional aspects will be set forth in part in the description which follows and, in part, will be apparent from the description, or may be learned by practice of the presented embodiments.

According to one or more example embodiments, a display apparatus includes a first pixel electrode and a second pixel electrode arranged to be spaced apart from each other over a substrate, a pixel definition layer including an opening exposing a central portion of each of the first pixel electrode and the second pixel electrode, an intermediate layer arranged over the first pixel electrode, the second pixel electrode, and the pixel definition layer and including a through hole exposing at least a portion of an upper surface of the pixel definition layer between the first pixel electrode and the second pixel electrode, an opposite electrode arranged over the intermediate layer to face the first pixel electrode and the second pixel electrode, and an inorganic encapsulation layer arranged over the opposite electrode.

According to some example embodiments, the opposite electrode may directly contact the upper surface of the pixel definition layer through the through hole.

According to some example embodiments, the display apparatus may further include a spacer arranged between the pixel definition layer and the opposite electrode to correspond to a space between the first pixel electrode and the second pixel electrode.

According to some example embodiments, the intermediate layer may not be arranged over an upper surface of the spacer.

According to some example embodiments, the opposite electrode may directly contact the upper surface of the spacer through the through hole.

According to some example embodiments, the spacer may include a recess portion in which a portion of an upper surface of the recess portion is recessed toward the substrate.

According to some example embodiments, the opposite electrode may directly contact an inner surface of the recess portion.

According to some example embodiments, a thickness of the inorganic encapsulation layer may be about 2,000 Å to about 2 μm.

According to some example embodiments, the inorganic encapsulation layer may include a multilayer structure of at least two layers.

According to some example embodiments, the inorganic encapsulation layer may include a first layer and a second layer sequentially stacked, and the first layer and the second layer may include a same material but have different composition ratios.

According to some example embodiments, a thicknesses of each of the first layer and the second layer may be about 500 Å to about 5,000 Å.

According to some example embodiments, the display apparatus may further include an input sensing layer including an organic planarization layer arranged over the inorganic encapsulation layer, an inorganic insulating layer arranged over the organic planarization layer, and a sensing electrode over the inorganic insulating layer.

According to some example embodiments, the organic planarization layer may be directly between the inorganic encapsulation layer and the inorganic insulating layer.

According to one or more example embodiments, a display apparatus includes a first pixel electrode and a second pixel electrode arranged to be spaced apart from each other over a substrate, a pixel definition layer including an opening exposing a central portion of each of the first pixel electrode and the second pixel electrode, a spacer arranged over the pixel definition layer to correspond to a space between the first pixel electrode and the second pixel electrode, an intermediate layer arranged over the first pixel electrode, the second pixel electrode, and the spacer are arranged, wherein a thickness of a first portion corresponding thereto over the spacer is less than a thickness of a second portion corresponding thereto over the first pixel electrode and the second pixel electrode, an opposite electrode arranged over the intermediate layer, and an inorganic encapsulation layer arranged over the opposite electrode.

According to some example embodiments, the intermediate layer may include a first emission layer and a second emission layer respectively arranged over the first pixel electrode and the second pixel electrode to be spaced apart from each other, a first functional layer between the first pixel electrode and the first emission layer and between the second pixel electrode and the second emission layer, and a second functional layer between the first emission layer, the second emission layer, and the opposite electrode, wherein a thickness of the second functional layer corresponding to the first portion may be less than a thickness of the second functional layer corresponding to the second portion.

According to some example embodiments, the intermediate layer may include a first emission layer and a second emission layer respectively arranged over the first pixel electrode and the second pixel electrode to be spaced apart from each other, a first functional layer between the first pixel electrode and the first emission layer and between the second pixel electrode and the second emission layer, and a second functional layer between the first emission layer, the second emission layer, and the opposite electrode, wherein a thickness of the first functional layer corresponding to the first portion may be less than a thickness of the second functional layer corresponding to the second portion.

According to some example embodiments, the second functional layer corresponding to the first portion may be removed.

According to one or more example embodiments, a method of manufacturing a display apparatus includes forming, over a substrate, a pixel circuit layer including a thin film transistor and a planarization layer over the thin film transistor, forming a pixel electrode over the pixel circuit layer, forming, over the pixel electrode, a pixel definition layer including an opening exposing a central portion of the pixel electrode, forming a spacer over the pixel definition layer, forming an intermediate layer over the pixel electrode, the pixel definition layer, and the spacer, removing at least a portion of the intermediate layer formed over the spacer, forming an opposite electrode over the intermediate layer, and forming an inorganic encapsulation layer over the opposite electrode.

According to some example embodiments, in the forming of the intermediate layer, particles may be formed over the spacer.

According to some example embodiments, in the removing of at least a portion of the intermediate layer, the particles formed over the spacer maybe removed concurrently with at least a portion of the intermediate layer.

According to some example embodiments, the removing of at least a portion of the intermediate layer may include removing the particles formed over the spacer by using a laser.

According to some example embodiments, the removing of at least a portion of the intermediate layer may include inverting the substrate such that that the intermediate layer faces the ground, and irradiating a laser toward the particles formed over the spacer.

According to some example embodiments, the removing of at least a portion of the intermediate layer may include arranging a mask including a through portion corresponding to the spacer to face the intermediate layer, and irradiating a laser to the particles formed over the spacer through the through portion.

According to some example embodiments, the removing of at least a portion of the intermediate layer may further include removing at least a portion of the spacer together.

According to some example embodiments, the opposite electrode may be formed to directly contact an upper surface of the spacer.

According to some example embodiments, the opposite electrode may be formed to directly contact an upper surface of the pixel definition layer corresponding to a portion where the spacer is formed.

According to some example embodiments, the inorganic encapsulation layer may be formed to a thickness of about 2,000 Å to about 2 μm.

According to some example embodiments, the inorganic encapsulation layer may be formed to include a multilayer structure of at least two layers.

According to some example embodiments, the forming of the inorganic encapsulation layer may include forming a first inorganic layer and forming a second inorganic layer, wherein the first inorganic layer and the second inorganic layer may be formed to have different composition ratios by varying an amount of gas injected into a chamber.

According to some example embodiments, the method may further include forming an input sensing layer over the inorganic encapsulation layer, wherein the forming of the input sensing layer may include forming an organic planarization layer over the inorganic encapsulation layer, and forming a touch layer over the organic planarization layer.

Other aspects, features, and characteristics other than those described above will become more apparent from the accompanying drawings, the appended claims, and the detailed description of the disclosure.

These general and example aspects may be implemented by using systems, methods, computer programs, or any combinations of systems, methods, and computer programs.

BRIEF DESCRIPTION OF THE DRAWINGS

The above and other aspects, features, and characteristics of certain example embodiments will be more apparent from the following description taken in conjunction with the accompanying drawings, in which.

DETAILED DESCRIPTION

Figure 1:
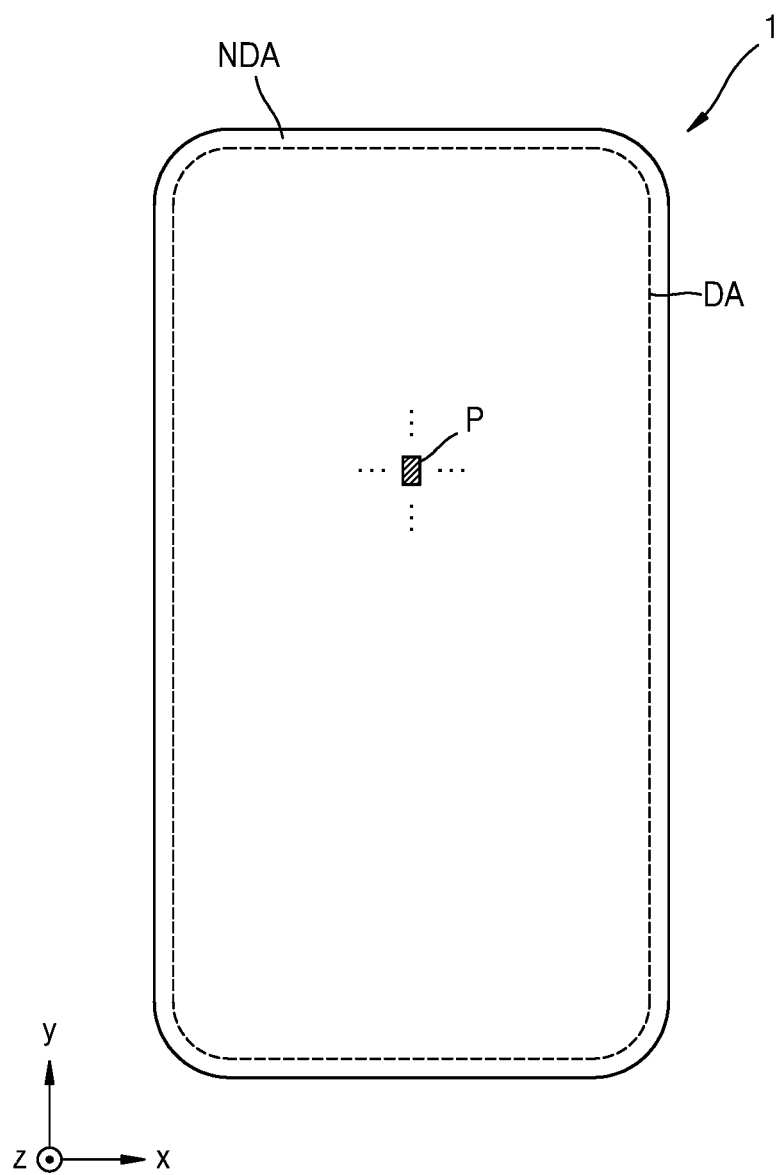
FIG. 1 is a plan view schematically illustrating a portion of a display apparatus 1 according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various example embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, embodiments according to the present disclosure are not limited to the example embodiments described below and may be embodied in various modes.

Hereinafter, aspects of some example embodiments will be described in more detail with reference to the accompanying drawings, and in the following description, like reference numerals will denote like elements and redundant descriptions thereof may be omitted for conciseness or brevity.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

As used herein, "A and/or B" represents the case of A, B, or A and B. Also, "at least one of A and B" represents the case of A, B, or A and B.

As used herein, the x-axis, the y-axis, and the z-axis are not limited to three axes of the rectangular coordinate system, and may be interpreted in a broader sense. For example, the x axis, the y axis, and the z axis may be perpendicular to one another or may represent different directions that are not perpendicular to one another.

When a certain embodiment may be implemented differently, a particular process order may be performed differently from the described order. For example, two consecutively described processes may be performed substantially at the same time or may be performed in an order opposite to the described order.

Sizes of components in the drawings may be exaggerated for convenience of description. In other words, because the sizes and thicknesses of components in the drawings are arbitrarily illustrated for convenience of description, embodiments according to the present disclosure are not limited thereto.

FIG. 1 is a plan view schematically illustrating a portion of a display apparatus 1 according to some example embodiments.

Referring to FIG. 1, the display apparatus 1 may include a display area DA and a peripheral area NDA outside the display area DA. A plurality of pixels P including display elements may be arranged in the display area DA, and the display apparatus 1 may display images by using the light emitted from the plurality of pixels P arranged in the display area DA. The peripheral area NDA may be a type of non-display area in which no display elements are arranged, and the display area DA may be entirely surrounded by the peripheral area NDA. For example, the peripheral area NDA may be a bezel area surrounding the display area DA.

Although FIG. 1 illustrates the display apparatus 1 having a flat or planar display surface, embodiments according to the present disclosure are not limited thereto. According to some example embodiments, the display apparatus 1 may include a three-dimensional display surface or a curved display surface.

When the display apparatus 1 includes a three-dimensional display surface, the display apparatus 1 may include a plurality of display areas indicating different directions and may include, for example, a polygonal columnar display surface. In other embodiments, when the display apparatus 1 includes a curved display surface, the display apparatus 1 may be implemented in various forms such as flexible, foldable, and rollable display apparatuses.

Also, according to some example embodiments, FIG. 1 illustrates the display apparatus 1 that may be applied to a mobile phone terminal. According to some example embodiments, a mobile phone terminal may be constructed by arranging electronic modules, a camera module, a power module, and the like mounted on a main board, together with the display apparatus 1, in a bracket/case or the like. The display apparatus 1 according to some example embodiments of the present disclosure may be applied to large electronic apparatuses such as televisions or monitors and small and medium electronic apparatuses such as tablets, car navigations, game machines, or smart watches.

FIG. 1 illustrates a case where the display area DA of the display apparatus 1 is in the shape of a tetragon with rounded corners; however, according to some example embodiments, the shape of the display area DA may also be circular, elliptical, or polygonal such as triangular or pentagonal.

Hereinafter, although an organic light emitting display apparatus is described as an example of the display apparatus 1 according to some example embodiments, the display apparatus according to embodiments of the present disclosure are not limited thereto. According to some example embodiments, the display apparatus 1 of the disclosure may be an inorganic light emitting display apparatus (inorganic light emitting display or inorganic EL display apparatus) or a display apparatus such as a quantum dot light emitting display apparatus. For example, an emission layer of a display element included in the display apparatus 1 may include an organic material, may include an inorganic material, may include quantum dots, may include an organic material and quantum dots, or may include an inorganic material and quantum dots.

Figure 2:
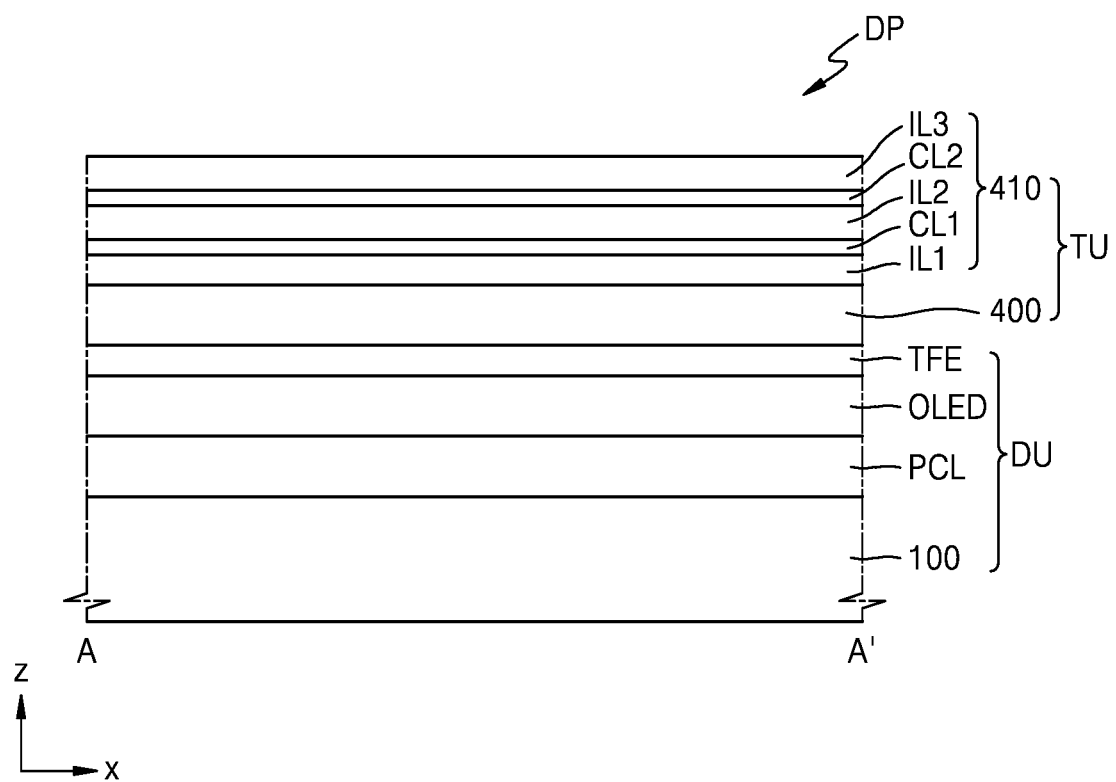
FIG. 2 is a cross-sectional view schematically illustrating a portion of a display apparatus 1 according to some example embodiments.

FIG. 2 is a cross-sectional view schematically illustrating a portion of a display apparatus 1 according to some example embodiments.

Referring to FIG. 2, the display apparatus 1 according to some example embodiments may include a display layer DU and an input sensing layer TU. The display layer DU and the input sensing layer TU arranged over (e.g., directly arranged over) the display layer DU may be collectively defined as a display panel DP. According to some example embodiments, a polarization layer and a window layer may be further arranged over the input sensing layer TU. At least some components among the display layer DU, the input sensing layer TU, the polarization layer, and the window layer may be formed by a continuous process, or at least some components may be coupled to each other through an adhesive member.

According to some example embodiments, the input sensing layer TU may be directly arranged over the display layer DU. Herein, "a component B is directly arranged over a component A" may mean that a separate adhesive layer/adhesive member is not arranged between the component A and the component B. The component B may be formed through a continuous process on a base surface provided by the component A after the component A is formed.

The display layer DU may generate an image, and the input sensing layer TU may acquire coordinate information of an external input (e.g., a touch event). According to some example embodiments, a display panel DP according to some example embodiments may further include a protection member arranged at a lower surface of the display layer DU. The protection member and the display layer DU may be coupled through an adhesive member.

In the display layer DU, a pixel circuit layer PCL, an organic light emitting diode OLED, and a thin film encapsulation layer TFE may be sequentially arranged over a substrate 100. The input sensing layer TU may be directly arranged over the thin film encapsulation layer TFE. As in FIG. 14 described below, because at least one organic planarization layer 400 (see, e.g., FIG. 14) is arranged over the thin film encapsulation layer TFE, a more planarized base surface may be provided. Thus, even when the components of the input sensing layer TU described below are formed by a continuous process, a defective rate may be reduced.

The input sensing layer TU may have a multilayer structure. The input sensing layer TU may include a sensing electrode, a signal line (trace line) connected to the sensing electrode, and at least one insulating layer. The input sensing layer TU may sense an external input, for example, by a capacitive method. In the disclosure, an operation method of the input sensing layer TU is not particularly limited, and the input sensing layer TU according to some example embodiments may sense an external input by an electromagnetic induction method or a pressure sensing method.

As illustrated in FIG. 2, the input sensing layer TU according to some example embodiments may include a first insulating layer IL1, a first conductive layer CL1, a second insulating layer IL2, a second conductive layer CL2, and a third insulating layer IL3. The sensing electrode may be formed by electrically connecting the first conductive layer CL1 and the second conductive layer CL2 to each other.

For example, each of the first conductive layer CL1 and the second conductive layer CL2 may have a single-layer structure or may have a stacked multilayer structure. The single-layer conductive layer may include a metal layer or a transparent conductive layer. The metal layer may include molybdenum, silver, titanium, copper, aluminum, or any alloy thereof. The transparent conductive layer may include a transparent conductive oxide such as indium tin oxide (ITO), indium zinc oxide (IZO), zinc oxide (ZnO), or indium tin zinc oxide (ITZO). Also, the transparent conductive layer may include a conductive polymer such as PEDOT, metal nanowire, graphene, or the like. The multilayer conductive layer may include multilayer metal layers. The multilayer metal layers may have, for example, a three-layer structure of Ti/Al/Ti. The multilayer conductive layer may include at least one metal layer and at least one transparent conductive layer.

Each of the first conductive layer CL1 and the second conductive layer CL2 may include a plurality of patterns. According to some example embodiments, the first conductive layer CL1 may include first conductive patterns, and the second conductive layer CL2 may include second conductive patterns. The first conductive patterns and the second conductive patterns may form the above sensing electrode. According to some example embodiments, the sensing electrode may have a mesh shape to prevent or reduce visibility of the sensing electrode by users.

Each of the first insulating layer IL1 to the third insulating layer IL3 may have a single-layer or multilayer structure. Each of the first insulating layer IL1 to the third insulating layer IL3 may include an inorganic material or a composite material. For example, at least one of the first insulating layer IL1 or the second insulating layer IL2 may include an inorganic layer. The inorganic layer may include at least one of aluminum oxide, titanium oxide, silicon oxide, silicon oxynitride, zirconium oxide, or hafnium oxide. In other embodiments, at least one of the first insulating layer IL1 to the third insulating layer IL3 may include an organic insulating material.

Moreover, the input sensing layer TU according to some example embodiments may further include an organic planarization layer 400. As described below, because the display apparatus 1 according to some example embodiments includes a single-layered inorganic encapsulation layer 300

(see, e.g., FIG. 6) as the thin film encapsulation layer TFE, when a touch layer 410 including the first insulating layer IL1 is directly arranged over the inorganic encapsulation layer 300, a defect may occur due to non-planarization of an upper surface of the display layer DU.

Thus, the organic planarization layer 400 may be arranged between the inorganic encapsulation layer 300 and the touch layer 410 such that the touch layer 410 may be arranged over a planarized surface thereof.

Figure 3:
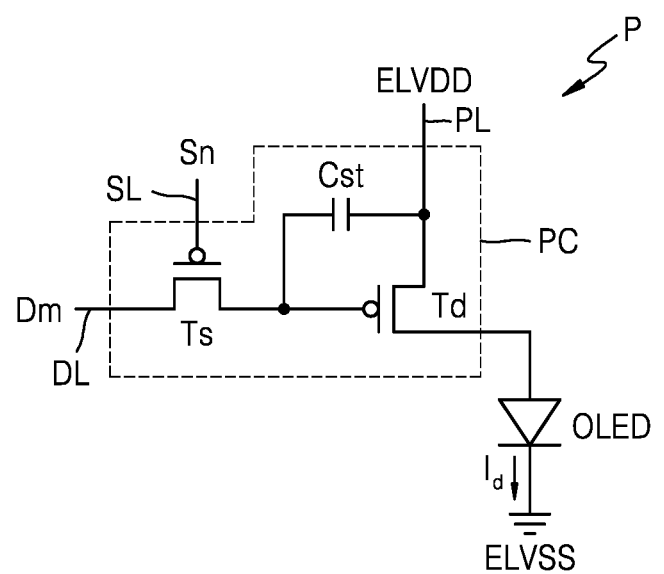
FIG. 3 is an equivalent circuit diagram of a pixel P that may be included in a display apparatus 1 according to some example embodiments.

FIG. 3 is an equivalent circuit diagram of a pixel P that may be included in a display apparatus 1 according to some example embodiments.

Figure 6:
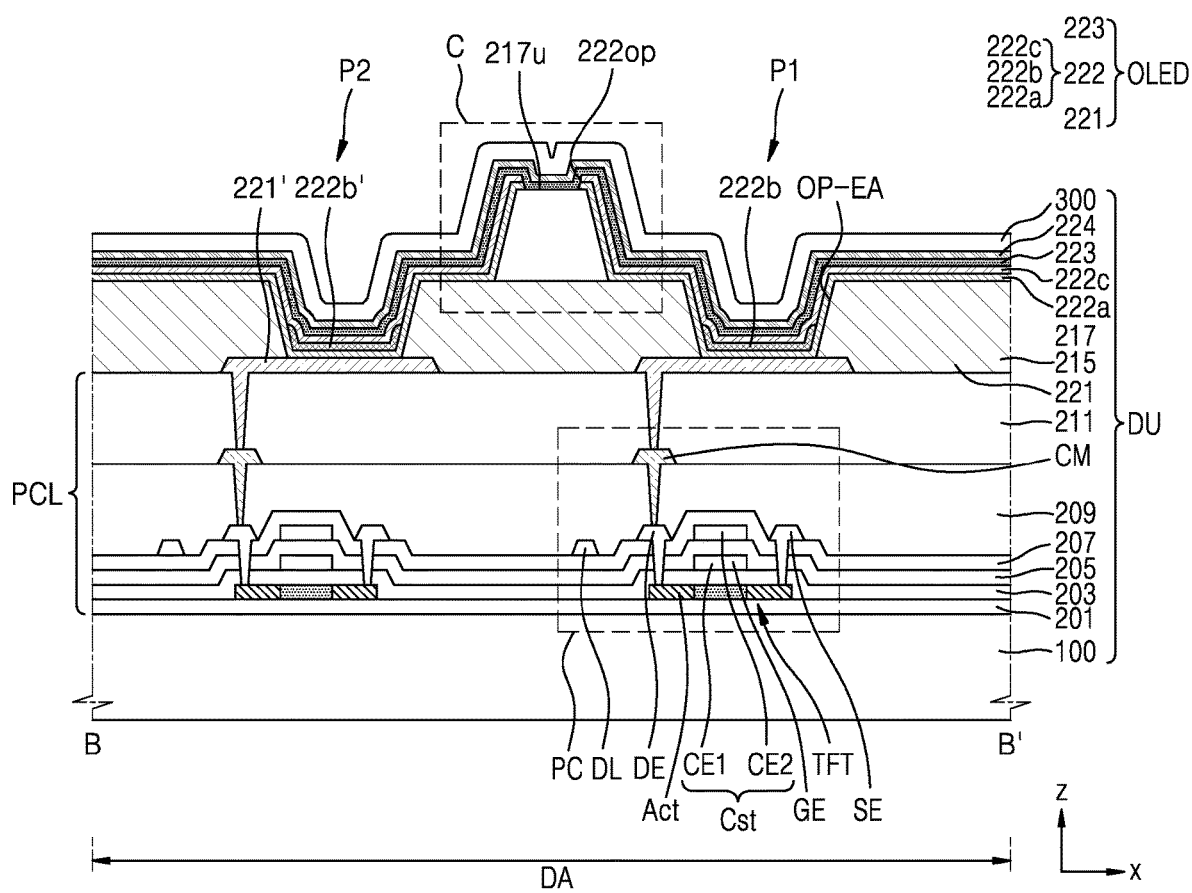
FIG. 6 is a cross-sectional view schematically illustrating a portion of a display apparatus according to some example embodiments, which corresponds to a cross-section taken along the line B-B' of FIG. 5 according to some example embodiments.

Referring to FIGS. 3 and 6, each pixel P may include a pixel circuit PC connected to a scan line SL and a data line DL and an organic light emitting diode OLED connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL and may be configured to transmit a data signal Dm input through the data line DL to the driving thin film transistor Td according to a scan signal Sn input through the scan line SL.

The storage capacitor Cst may be connected to the switching thin film transistor Ts and a driving voltage line PL and may store a voltage corresponding to the difference between a voltage received from the switching thin film transistor Ts and a driving voltage ELVDD supplied to the driving voltage line PL.

The driving thin film transistor Td may be connected to the driving voltage line PL and the storage capacitor Cst and may control a driving current $I_d$ flowing from the driving voltage line PL through the organic light emitting diode OLED in response to a voltage value stored in the storage capacitor Cst. The organic light emitting diode OLED may emit light with a certain brightness according to the driving current $I_d$.

Although FIG. 3 illustrates that the pixel circuit PC includes two thin film transistors and one storage capacitor, embodiments according to the present disclosure are not limited thereto. According to some example embodiments, the pixel circuit PC may include seven thin film transistors and one storage capacitor. According to some example embodiments, the pixel circuit PC may include two or more storage capacitors. According to some example embodiments, the pixel circuit PC may include any suitable number of transistors, capacitors, or other electrical components according to the design of the display apparatus 1.

Figure 4:
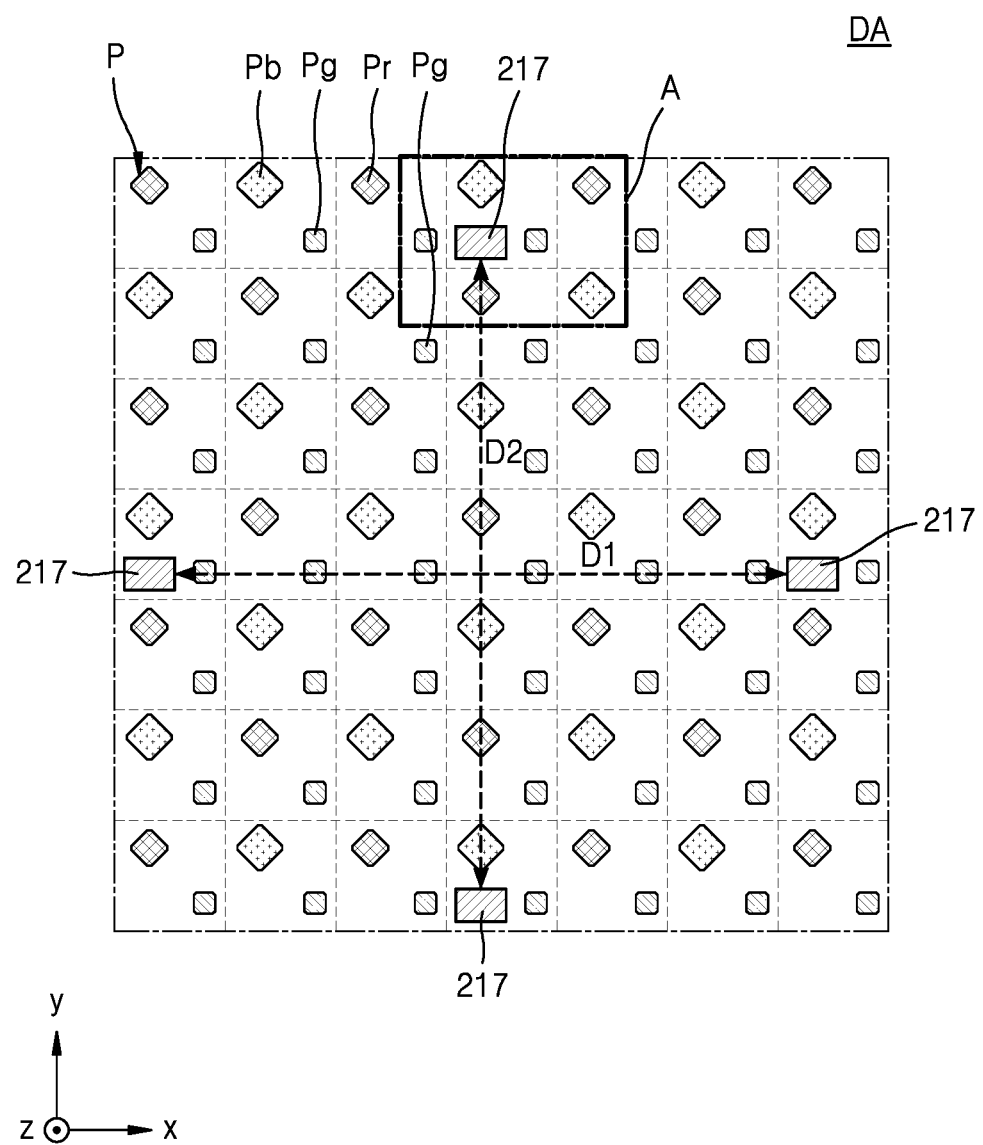
FIG. 4 is a plan view schematically illustrating a portion of a display area DA of a display apparatus 1 according to some example embodiments.
Figure 5:
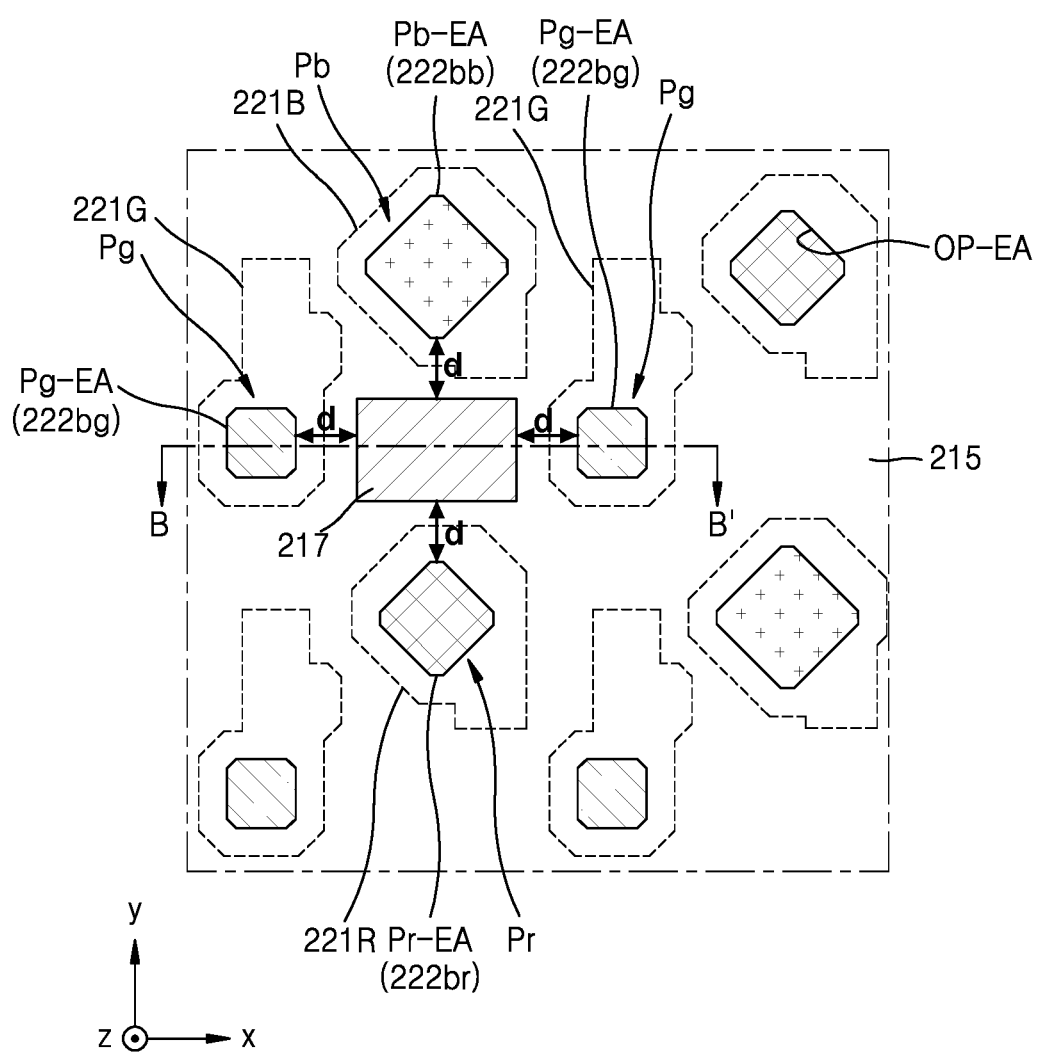
FIG. 5 is an enlarged plan view schematically illustrating a region A of FIG. 4 according to some example embodiments.

FIG. 4 is a plan view schematically illustrating a portion of a display area DA of a display apparatus 1 according to some example embodiments, and FIG. 5 is an enlarged plan view schematically illustrating a region A of FIG. 4.

Referring to FIG. 4, a plurality of pixels P may be arranged over the display area DA. Each of the plurality of pixels P may include a display element such as an organic light emitting diode OLED. Each pixel P may be a subpixel emitting red, green, blue, or white light.

According to some example embodiments, the plurality of pixels P arranged over the display area DA may include a pixel Pr emitting red light, a pixel Pg emitting green light, and a pixel Pb emitting blue light. Although FIG. 4 illustrates that the plurality of pixels P are arranged in a so-called diamond matrix or arrangement (e.g., an RBGB or RBGW matrix, or a Pentile™ arrangement) pentile type, the plurality of pixels P may be arranged in various shapes such as a stripe type or a general matrix (e.g., an RBGB or RBGW matrix, or a Pentile™ arrangement). Also, according to some example embodiments, in the case of virtual cells arranged in a grid shape, two pixels P may be arranged in one cell. For example, in FIG. 4, a red light emitting pixel Pr and a green light emitting pixel Pg, or a green light emitting pixel Pg and a blue light emitting pixel Pb may be arranged in each cell.

A spacer 217 may be arranged over the display area DA. A plurality of spacers 217 may be arranged over the display area DA and may be spaced apart from each other with a plurality of pixels P therebetween as illustrated in FIG. 4. Although FIG. 4 illustrates a structure in which a plurality of spacers 217 are spaced at equal intervals along one direction (e.g., x direction) and another direction (e.g., y direction), embodiments according to the present disclosure are not limited thereto.

For example, referring to FIG. 5, the arrangement of pixels Pr, Pg, and Pb around the spacer 217 is illustrated. The pixels Pr, Pg, and Pb may be arranged to surround the spacer 217. In other words, the spacer 217 may be arranged between the pixels Pr, Pg, and Pb. For example, the pixels Pr, Pg, and Pb may be arranged above, below, left, and right around the spacer 217.

The pixels Pr, Pg, and Pb may include emission layers 222*br*, 222*bg*, and 222*bb* respectively arranged over pixel electrodes 221R, 221G, and 221B. A pixel definition layer 215 may include an opening OP-EA exposing a central portion of each of the pixel electrodes 221R, 221G, and 221B, and the emission layers 222*br*, 222*bg*, 222*bb* may be arranged in the opening OP-EA. Emission areas Pr-EA, Pg-EA, and Pb-EA of the pixels Pr, Pg, and Pb may be defined by the opening OP-EA.

The spacer 217 may be arranged between the pixels Pr, Pg, and Pb and may be arranged to be spaced at the same distance d with respect to the opening OP-EA of each of the pixels Pr, Pg, and Pb. Because the spacer 217 between the pixels Pr, Pg, and Pb is located in the direction in which light is emitted, it may be beneficial in terms of the light emission uniformity of the pixels Pr, Pg, and Pb around the spacer 217 to arrange the spacer 217 to be spaced at the same distance d from the emission areas Pr-EA, Pg-EA, and Pb-EA of the pixels Pr, Pg, and Pb as described above. For this purpose, the spacer 217 of FIG. 5 may have a width in one direction (e.g., in the x direction) greater than a width in another direction (e.g., in the y direction); however, embodiments according to the present disclosure are not limited thereto. Also, according to some example embodiments, one spacer 217 is provided in FIG. 5; however, a plurality of spacers 217 may be provided between the pixels Pr, Pg, and Pb.

In order to prevent or reduce defect in the display apparatus 1, such as an imprint at the display area DA, occurring due to the sag of a fine metal mask (FMM) used in the process of forming the emission layer for each pixel P, the spacer 217 may contact and support the FMM. In this process, the FMM may directly contact the upper surface of the spacer 217. In this case, large particles Pc (see FIG. 15) may occur at the upper surface of the spacer 217 due to the contact with the FMM as described below. The particles Pc may have a width of, for example, about 2 μm to about 5 μm to make the profile over the spacer 217 unstable, thus causing a defect such as a crack in the upper layers thereover.

Thus, in the display apparatus 1 according to some example embodiments, by forming an opposite electrode 223 after removing the particles Pc over the spacer 217, it may be possible to prevent or reduce instances of a crack occurring in the opposite electrode 223 and the upper layers thereover. Also, due to this, because a single-layer inorganic encapsulation layer 300 formed of an inorganic insulating material over an organic light emitting diode OLED may be implemented as a thin film encapsulation layer TFE, the thickness of the thin film encapsulation layer TFE of the display apparatus 1 may be significantly reduced to reduce the overall thickness of the display apparatus 1 and simplify the manufacturing process thereof.

Figure 7:
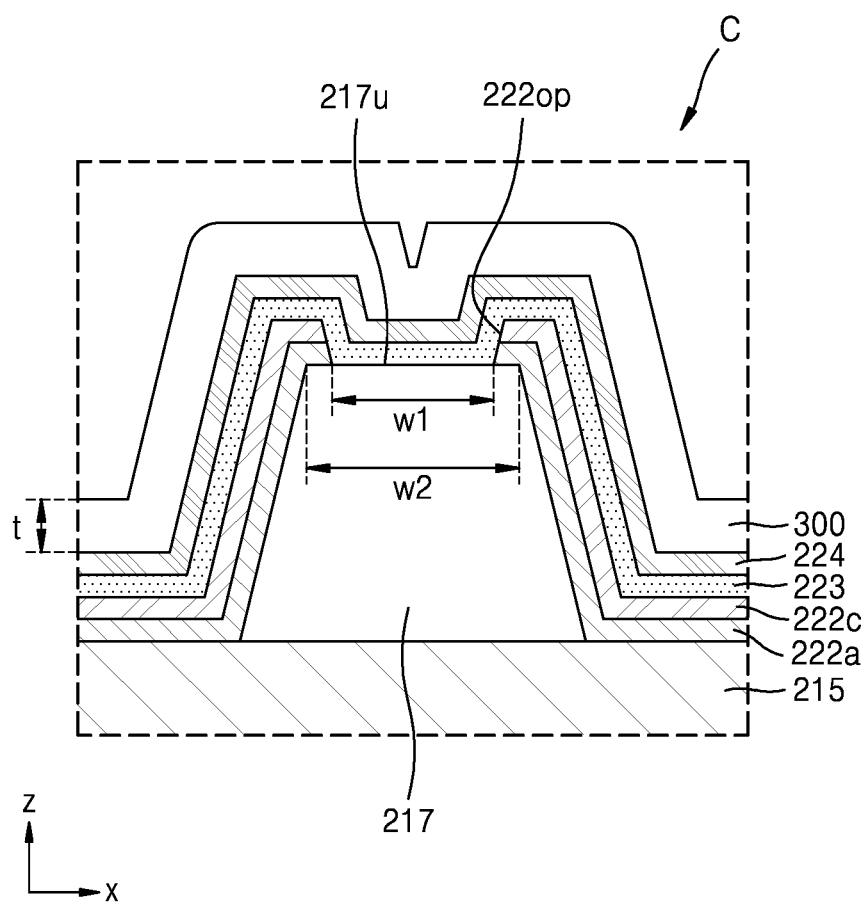
FIG. 7 is an enlarged cross-sectional view illustrating a region C of FIG. 6 according to some example embodiments.
Figure 8:
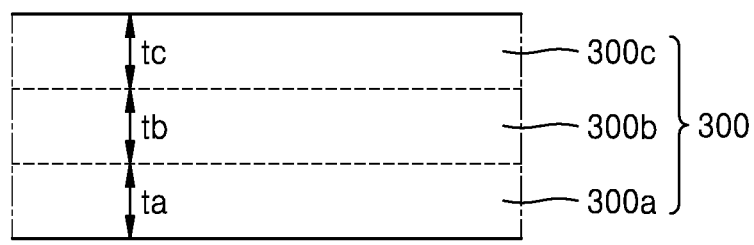
FIG. 8 is a cross-sectional view schematically illustrating an inorganic encapsulation layer 300 according to some example embodiments.

FIG. 6 is a cross-sectional view schematically illustrating a portion of a display apparatus according to some example embodiments, which corresponds to a cross-section taken along the line B-B' of FIG. 5. FIG. 7 is an enlarged cross-sectional view illustrating a region C of FIG. 6, and FIG. 8 is a cross-sectional view schematically illustrating an inorganic encapsulation layer 300 according to some example embodiments.

Referring to FIG. 6, a first pixel P1 and a second pixel P2 may be arranged over a substrate 100. Because the first pixel P1 and the second pixel P2 have the same structure, a stack structure thereof will be described below mainly with respect to one pixel thereof.

First, the substrate 100 may include a glass material or a polymer resin. According to some example embodiments, the substrate 100 may include a plurality of sublayers. The plurality of sublayers may be a structure in which an organic layer and an inorganic layer are alternately stacked. When the substrate 100 includes a polymer resin, it may include polyethersulfone, polyacrylate, polyetherimide, polyethylene naphthalate, polyethylene terephthalate, polyphenylene sulfide, polyarylate, polyimide, polycarbonate, or cellulose acetate propionate.

A display layer 200 including a display element such as an organic light emitting diode and a thin film encapsulation layer TFE covering the display layer 200 may be arranged over the substrate 100. Hereinafter, the display layer 200 will be described in detail.

A buffer layer 201 may be formed over the substrate 100 to prevent or reduce instances of impurities penetrating into a semiconductor layer Act of a thin film transistor TFT. The buffer layer 201 may include an inorganic insulating material such as silicon nitride, silicon oxynitride, and silicon oxide and may be a single layer or a multiple layer including the inorganic insulating material.

A pixel circuit PC may be arranged over the buffer layer 201. The pixel circuit PC may be arranged to correspond to each pixel P. The pixel circuit PC may include a thin film transistor TFT and a storage capacitor Cst. The thin film transistor TFT may include a semiconductor layer Act, a gate electrode GE, a source electrode SE, and a drain electrode DE.

According to some example embodiments, a data line DL of the pixel circuit PC may be electrically connected to a switching thin film transistor included in the pixel circuit PC. According to some example embodiments, a top gate type transistor in which a gate electrode GE is arranged over the semiconductor layer Act with a gate insulating layer 203 therebetween is illustrated; however, according to some example embodiments, the thin film transistor TFT may be a bottom gate type transistor.

The semiconductor layer Act may include polysilicon. Alternatively, the semiconductor layer Act may include amorphous silicon, may include an oxide semiconductor, or may include an organic semiconductor or the like. The gate electrode GE may include a low-resistance metal material. The gate electrode GE may include a conductive material including molybdenum (Mo), aluminum (Al), copper (Cu), titanium (Ti), or the like and may include a single layer or a multiple layer including the above material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 203 may include a single layer or a multiple layer including the above material.

The source electrode SE and the drain electrode DE may be located over the same layer as the data line DL and may include the same material. The source electrode SE, the drain electrode DE, and the data line DL may include a material having high conductivity. The source electrode SE and the drain electrode DE may include a conductive material including molybdenum (Mo), aluminum (Al), copper (Cu), titanium (Ti), or the like and may include a single layer or a multiple layer including the above material. According to some example embodiments, the source electrode SE, the drain electrode DE, and the data line DL may include a multiple layer of Ti/Al/Ti.

The storage capacitor Cst may include a lower electrode CE1 and an upper electrode CE2 overlapping each other with a first interlayer insulating layer 205 therebetween. The storage capacitor Cst may overlap the thin film transistor TFT. In this regard, FIG. 5 illustrates that the gate electrode GE of the thin film transistor TFT is the lower electrode CE1 of the storage capacitor Cst. In other embodiments, the storage capacitor Cst may not overlap the thin film transistor TFT. The storage capacitor Cst may be covered by a second interlayer insulating layer 207. The upper electrode CE2 of the storage capacitor Cst may include a conductive material including molybdenum (Mo), aluminum (Al), copper (Cu), titanium (Ti), or the like and may include a single layer or a multiple layer including the above material.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, or hafnium oxide. The first interlayer insulating layer 205 and the second interlayer insulating layer 207 may include a single layer or a multiple layer including the above material.

The pixel circuit PC including the thin film transistor TFT and the storage capacitor Cst may be covered by a first organic insulating layer 209. The first organic insulating layer 209 may include a substantially flat upper surface.

According to some example embodiments, a third interlayer insulating layer may be further arranged under the first organic insulating layer 209. The third interlayer insulating layer may include an inorganic insulating material such as silicon oxide, silicon nitride, or silicon oxynitride.

The pixel circuit PC may be electrically connected to a pixel electrode 221. For example, as illustrated in FIG. 6, a contact metal layer CM may be arranged between the thin film transistor TFT and the pixel electrode 221. The contact metal layer CM may be connected to the thin film transistor TFT through a contact hole formed in the first organic insulating layer 209, and the pixel electrode 221 may be connected to the contact metal layer CM through a contact hole formed in a second organic insulating layer 211 on the contact metal layer CM. The contact metal layer CM may include a conductive material including molybdenum (Mo), aluminum (Al), copper (Cu), titanium (Ti), or the like and may include a single layer or a multiple layer including the above material. According to some example embodiments, the contact metal layer CM may include a multiple layer of Ti/Al/Ti.

The first organic insulating layer 209 and the second organic insulating layer 211 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. According to some example embodiments, the first organic insulating layer 209 and the second organic insulating layer 211 may include polyimide.

The pixel electrode 221 may be formed over the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to some example embodiments, the pixel electrode 221 may further include a layer formed of ITO, IZO, ZnO, or $In_2O_3$ over/under the above reflective layer.

A pixel definition layer 215 may be formed over the pixel electrode 221 (e.g., first pixel electrode). The pixel definition layer 215 may include an opening OP-EA exposing the upper surface of the pixel electrode 221 and may cover the edge of the pixel electrode 221. The pixel definition layer 215 may include an organic insulating material. Alternatively, the pixel definition layer 215 may include an inorganic insulating material such as silicon nitride, silicon oxynitride, or silicon oxide. Alternatively, the pixel definition layer 215 may include an organic insulating material and an inorganic insulating material An intermediate layer 222 may include an emission layer 222b. The intermediate layer 222 may include a first functional layer 222a arranged under the emission layer 222b and/or a second functional layer 222c arranged over the emission layer 222b. The emission layer 222b may include a high-molecular or low-molecular weight organic material for emitting light of a certain color.

The first functional layer 222a may include a single layer or a multiple layer. For example, when the first functional layer 222a is formed of a high-molecular weight material, the first functional layer 222a may include a hole transport layer (HTL) having a single-layer structure and may be formed of poly-(3,4)-ethylene-dihydroxy thiophene (PEDOT) or polyaniline (PANI). When the first functional layer 222a is formed of a low-molecular weight material, the first functional layer 222a may include a hole injection layer (HIL) and a hole transport layer (HTL).

The second functional layer 222c may be omitted. For example, when the first functional layer 222a and the emission layer 222b are formed of a high-molecular weight material, the second functional layer 222c may be formed. The second functional layer 222c may include a single layer or a multiple layer. The second functional layer 222c may include an electron transport layer (ETL) and/or an electron injection layer (EIL).

The emission layer 222b of the intermediate layer 222 may be arranged for each pixel in the display area DA. The emission layer 222b may be patterned to correspond to the pixel electrode 221. Unlike the emission layer 222b, the first functional layer 222a and/or the second functional layer 222c of the intermediate layer 222 may extend toward the peripheral area NDA to be located not only in the display area DA but also in a portion of the peripheral area NDA.

An opposite electrode 223 may include a conductive material having a low work function. For example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 223 may further include a layer such as ITO, IZO, ZnO, or $In_2O_3$ over the (semi) transparent layer including the above material. The opposite electrode 223 may be formed over the peripheral area NDA as well as over the display area DA. The opposite electrode 223 extending toward the peripheral area NDA may be electrically connected to a second power supply line.

The first functional layer 222a, the second functional layer 222c, and the opposite electrode 223 may be formed by thermal evaporation.

According to some example embodiments, a capping layer 224 may be arranged over the opposite electrode 223. For example, the capping layer 224 may be provided as a single layer or a multiple layer including a material selected from an organic material, an inorganic material, and a mixture thereof. According to some example embodiments, a LiF layer may be located over the capping layer 224.

A spacer 217 may be arranged over the pixel definition layer 215. The spacer 217 may be arranged over the pixel definition layer 215 between a first pixel electrode 221 and a second pixel electrode 221'. As described above, because the spacer 217 is provided to support the FMM, it may be provided to have a certain height.

The spacer 217 may include an organic insulating material such as polyimide. Alternatively, the spacer 217 may include an inorganic insulating material or may include an organic insulating material and an inorganic insulating material. According to some example embodiments, the spacer 217 may include a different material than the pixel definition layer 215 or may include the same material as the pixel definition layer 215. For example, the pixel definition layer 215 and the spacer 217 may include polyimide. In this case, the pixel definition layer 215 and the spacer 217 may be formed together in a mask process using a halftone mask.

Referring to FIG. 7 together, according to some example embodiments, the intermediate layer 222 corresponding to an upper surface 217u of the spacer 217 may be removed. In other words, a through hole 222op may be formed in the intermediate layer 222 to correspond to the upper surface 217u of the spacer 217. It may be understood that the through hole 222op is removed together in the process of removing the particles Pc (see FIG. 15) located at the upper surface 217u of the spacer 217 during the manufacturing process thereof. Although FIGS. 6 and 7 illustrate that a width w1 of the through hole 222op is smaller than a width w2 of the upper surface 217u of the spacer 217, embodiments according to the present disclosure are not limited thereto.

The process of removing the particles Pc from the upper surface 217u of the spacer 217 may be performed before the process of forming the opposite electrode 223. Thus, at least a portion of the opposite electrode 223 may directly contact the upper surface 217u of the spacer 217 exposed to the outside through the through hole 222op.

Referring back to FIG. 6, an inorganic encapsulation layer 300 may be arranged over the capping layer 224. An organic light emitting diode OLED may be encapsulated by the inorganic encapsulation layer 300 to be blocked from external air. The inorganic encapsulation layer 300 may be integrally provided at the entire surface of the display area DA.

A thin film encapsulation layer TFE may include an inorganic encapsulation layer 300. According to some example embodiments, the thin film encapsulation layer TFE may have a single-layer structure formed of an inorganic encapsulation layer 300. The inorganic encapsulation layer 300 may include one or more inorganic materials among aluminum oxide, titanium oxide, tantalum oxide, hafnium oxide, zinc oxide, silicon oxide, silicon nitride, and silicon oxynitride.

According to some example embodiments, the inorganic encapsulation layer 300 may have a thickness t of, for example, 0.2 µm (or about 0.2 µm) to 2 µm (or about 2 µm) and may be formed to a thickness t of 0.8 µm (or about 0.8 µm) to 1.2 µm (or about 1.2 µm). This may be a comparative example and may reduce the overall thickness of the display apparatus 1 by significantly reduce the thickness of the thin film encapsulation layer TFE compared to the case where the thin film encapsulation layer of the display apparatus includes at least one inorganic encapsulation layer and at least one organic encapsulation layer.

As described above, according to some example embodiments, by removing the particles Pc formed over the spacer 217 to reduce the encapsulation force of the upper layers, for example, the inorganic encapsulation layer 300, during the manufacturing process, the display apparatus 1 having an excellent encapsulation force may be provided only by the inorganic encapsulation layer 300 having a single-layer structure.

Moreover, referring to FIG. 8, the inorganic encapsulation layer 300 may have a multilayer structure of at least two layers. In this case, the "multilayer structure" may include not only a plurality of layers that are structurally classified, but also a plurality of layers that are classified through component analysis although not structurally classified.

According to some example embodiments, the inorganic encapsulation layer 300 may include a first layer 300a, a second layer 300b, and a third layer 300c that are sequentially stacked. The first layer 300a, the second layer 300b, and the third layer 300c may be an inorganic layer including an inorganic insulating material; for example, the first layer 300a, the second layer 300b, and the third layer 300c may include the same material or may include different materials or only some of them may include the same material. The first layer 300a, the second layer 300b, and the third layer 300c may include, for example, a material selected from among aluminum oxide, titanium oxide, tantalum oxide, hafnium oxide, zinc oxide, silicon oxide, silicon nitride, and silicon oxynitride.

It may be beneficial to include a nitride-based material such as silicon nitride in order to enhance the barrier characteristics of the inorganic encapsulation layer 300, and it may be beneficial to include silicon oxide or silicon oxynitride in order to improve the transmittance of the inorganic encapsulation layer 300. For example, the first layer 300a may include silicon nitride, and the second layer 300b and the third layer 300c may include silicon oxide or silicon oxynitride.

Thicknesses ta, tb, and tc of the first layer 300a, the second layer 300b, and the third layer 300c may be 500 Å (e.g., about 500 Å) to 5000 Å (e.g., about 5000 Å). The thicknesses ta, tb, and tc of the first layer 300a, the second layer 300b, and the third layer 300c may be equal to or different from each other.

Moreover, the inorganic encapsulation layer 300 may include a plurality of layers that are not structurally classified. Substantially, the plurality of layers may include the same material but may have different components or different composition ratios. The inorganic encapsulation layer 300 may be formed by, for example, chemical vapor deposition (CVD). In this case, the plurality of layers that are not structurally classified may be implemented by changing the amount or type of gas injected into a chamber while being formed by chemical vapor deposition.

As such, by forming the inorganic encapsulation layer 300 in a multilayer structure of inorganic layers, the encapsulation force of the thin film encapsulation layer TFE may be effectively improved.

Figure 9:
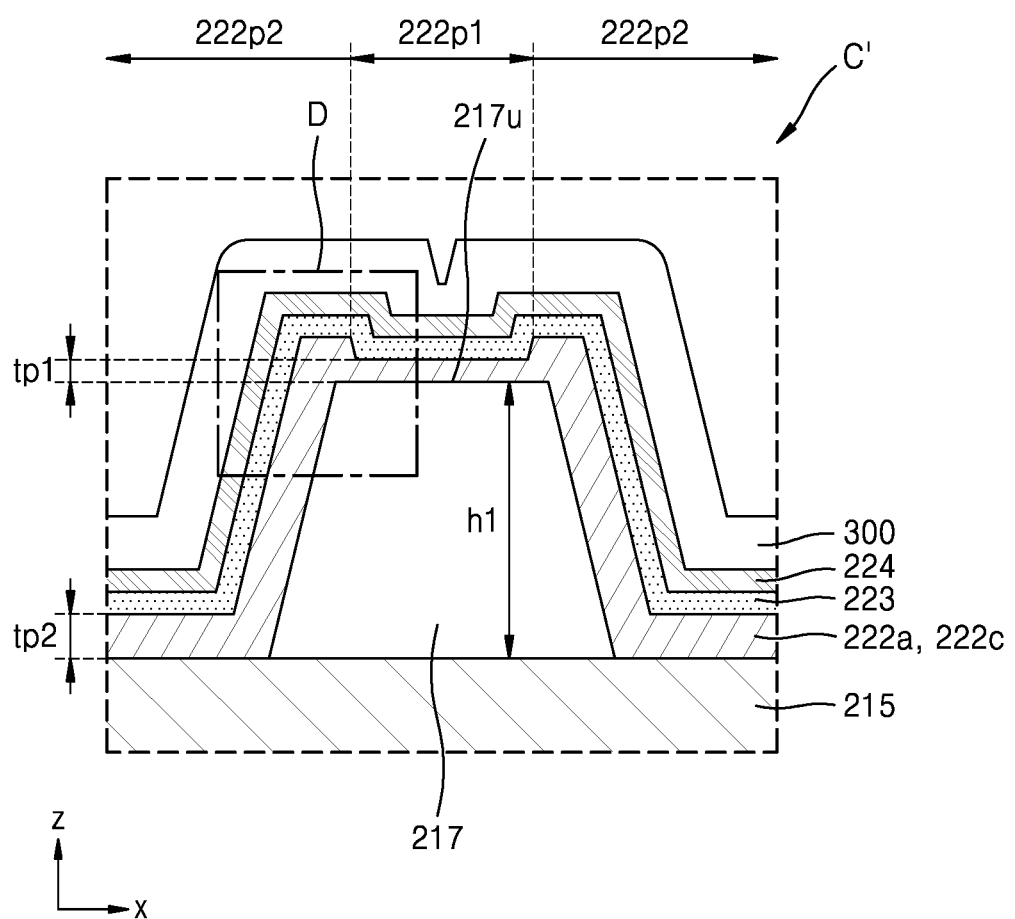
FIG. 9 is a cross-sectional view illustrating another example C' of the region C of FIG. 6 according to some example embodiments.

FIG. 9 is a cross-sectional view illustrating another example C' of the region C of FIG. 6, and FIGS. 10A to 10C are enlarged cross-sectional views illustrating embodiments D, D', and D" of a region D of FIG. 9.

Referring to FIG. 9, functional layers 222a and 222c, an opposite electrode 223, and a capping layer 224 may be sequentially stacked over the upper surface 217u of the spacer 217. An inorganic encapsulation layer 300 may be arranged to cover the capping layer 224. According to some example embodiments, the functional layers 222a and 222c may be first and second functional layers 222a and 222c excluding the emission layer.

At least a portion of the functional layers 222a and 222c arranged over the upper surface 217u of the spacer 217 may be removed. According to some example embodiments, a thickness of a portion of the functional layers 222a and 222c located over the upper surface 217u of the spacer 217 may be smaller than a thickness of the other portion thereof. For example, when a portion of the functional layers 222a and 222c located over the upper surface 217u of the spacer 217 is referred to as a first portion 222p1 and the other portion thereof is referred to as a second portion 222p2, a thickness tp1 of the first portion 222p1 may be smaller than a thickness tp2 of the second portion 222p2. An example of the second portion 222p2 of the functional layers 222a and 222c may be a portion corresponding thereto over the pixel electrode 221 of FIG. 6 but embodiments according to the present disclosure are not limited thereto. However, for a clear thickness comparison between the first portion 222p1 and the second portion 222p2, like the first portion 222p1, the second portion 222p2 may be a portion provided over a flat surface. This structure may be understood as a structure formed by removing a portion of the functional layers 222a and 222c together in the process of removing the particles Pc formed over the spacer 217 during the manufacturing process.

Example embodiments of the functional layers 222a and 222c of FIG. 10 will be described with reference to FIGS. 10A to 10C. In the embodiments D, D', and D" of FIGS. 10A to 10C, a through hole and/or a recess may be formed in the functional layers 222a and 222c corresponding to the upper surface 217u of the spacer 217.

The functional layers 222a and 222c may include a first functional layer 222a and a second functional layer 222c over the first functional layer 222a. In other embodiments, the functional layers 222a and 222c may include only one of the first functional layer 222a and the second functional layer 222c.

Figure 10A:
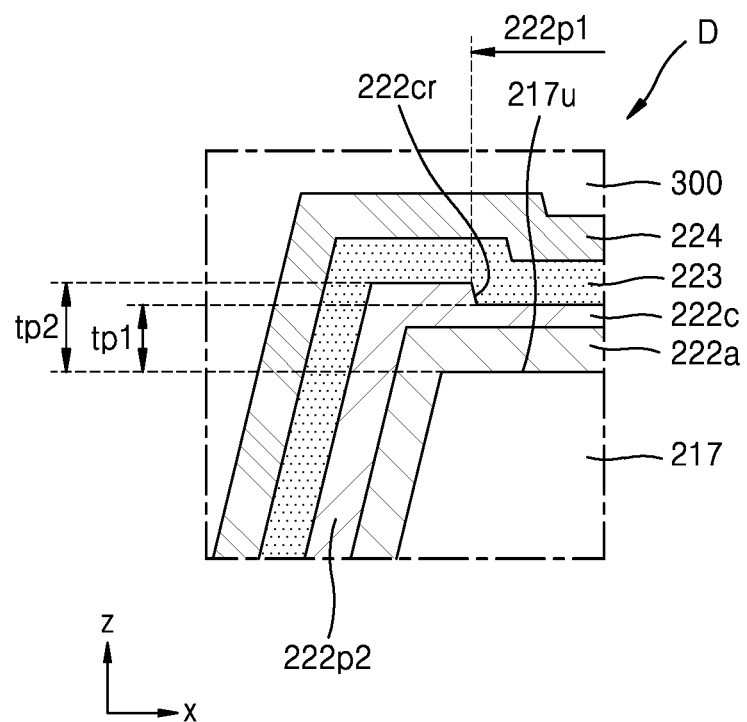
FIGS. 10A to 10C are enlarged cross-sectional views illustrating examples D, D', and D'' of a region D of FIG. 9.

Referring to FIG. 10A, a recess 222cr may be formed in the second functional layer 222c to correspond to the first portion 222p1. That is, in the example D of FIG. 10A, the first functional layer 222a may not be removed and only a portion of the second functional layer 222c may be removed. The first functional layer 222a may have the same thickness as a whole, but a thickness of the first portion 222p1 of the second functional layer 222c may be smaller than a thickness of the second portion 222p2 thereof. Accordingly, a thickness tp1 of the functional layers 222a and 222c corresponding to the first portion 222p1 may be smaller than a thickness tp2 of the functional layers 222a and 222c corresponding to the second portion 222p2.

Figure 10B:
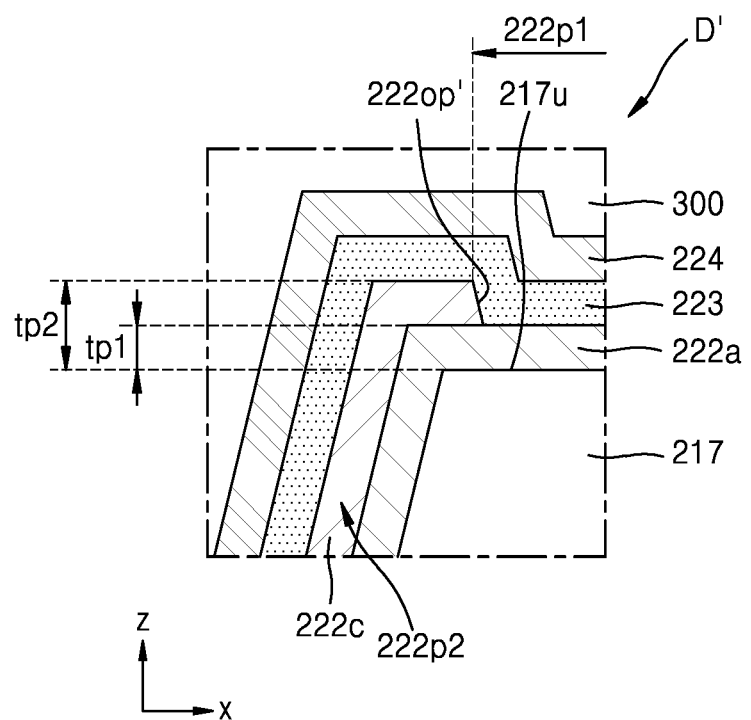

Referring to FIG. 10B, a through hole 222op' may be formed in the second functional layer 222c to correspond to the first portion 222p1. That is, in the example D' of FIG. 10B, the second functional layer 222c corresponding to the first portion 222p1 may be entirely removed. The first functional layer 222a may be exposed through the through hole 222op' of the second functional layer 222c. An opposite electrode 223 may directly contact the first functional layer 222a exposed through the through hole 222op' to correspond to the first portion 222p1.

Figure 10C:
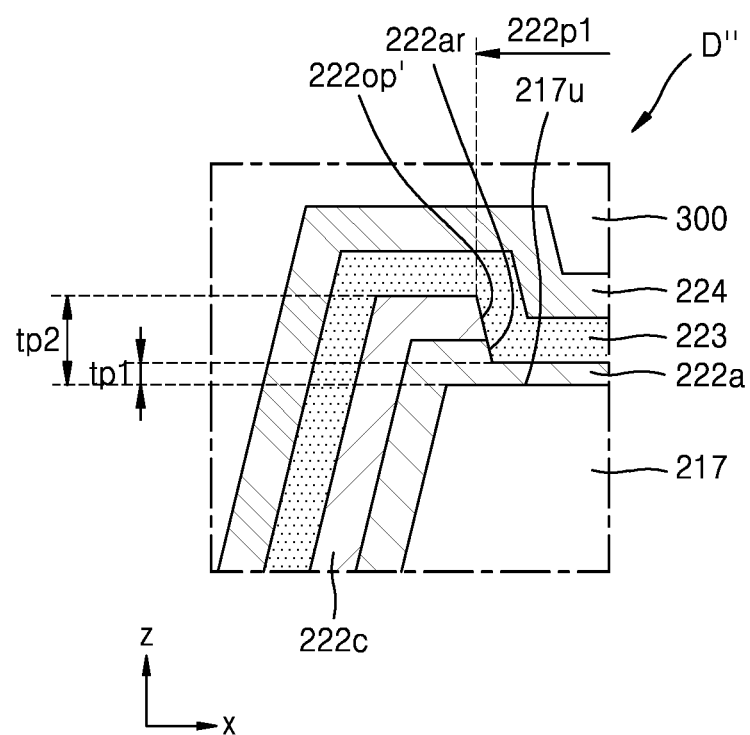

Referring to FIG. 10C, corresponding to the first portion 222p1, the second functional layer 222c may include a through hole 222op' and the first functional layer 222a may include a recess 222ar. That is, in the example D" of FIG. 10C, the second functional layer 222c corresponding to the first portion 222p1 may be entirely removed and the first functional layer 222a corresponding thereto may be partially removed. Accordingly, a thickness tp1 of the functional layers 222a and 222c corresponding to the first portion 222p1 may be smaller than a thickness tp2 of the functional layers 222a and 222c corresponding to the second portion 222p2.

Figure 11:
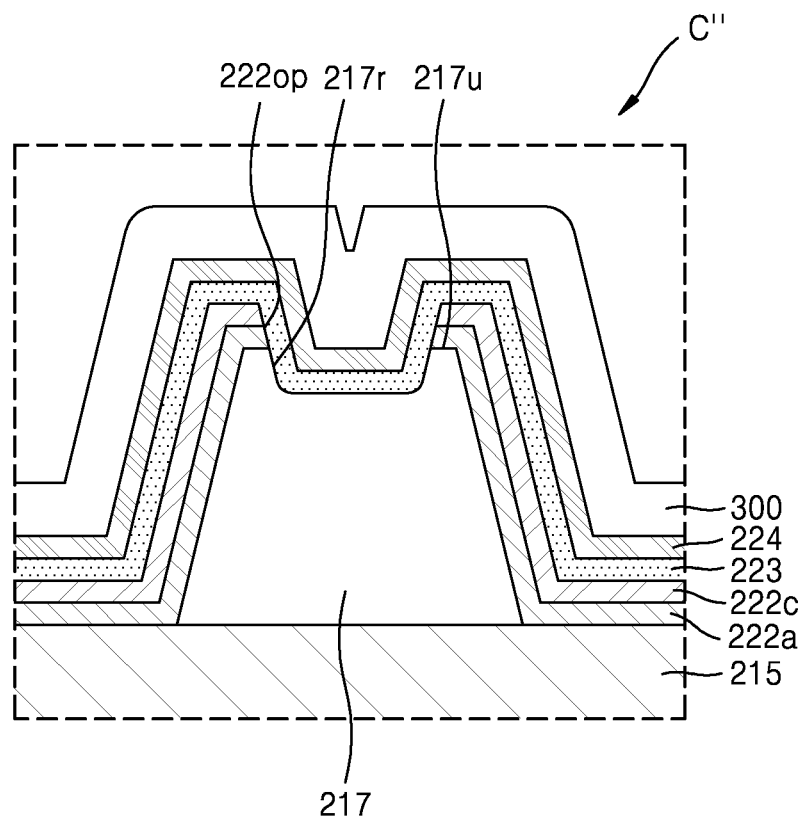
FIGS. 11 and 12 are cross-sectional views schematically illustrating a portion of a display apparatus according to some example embodiments.
Figure 12:
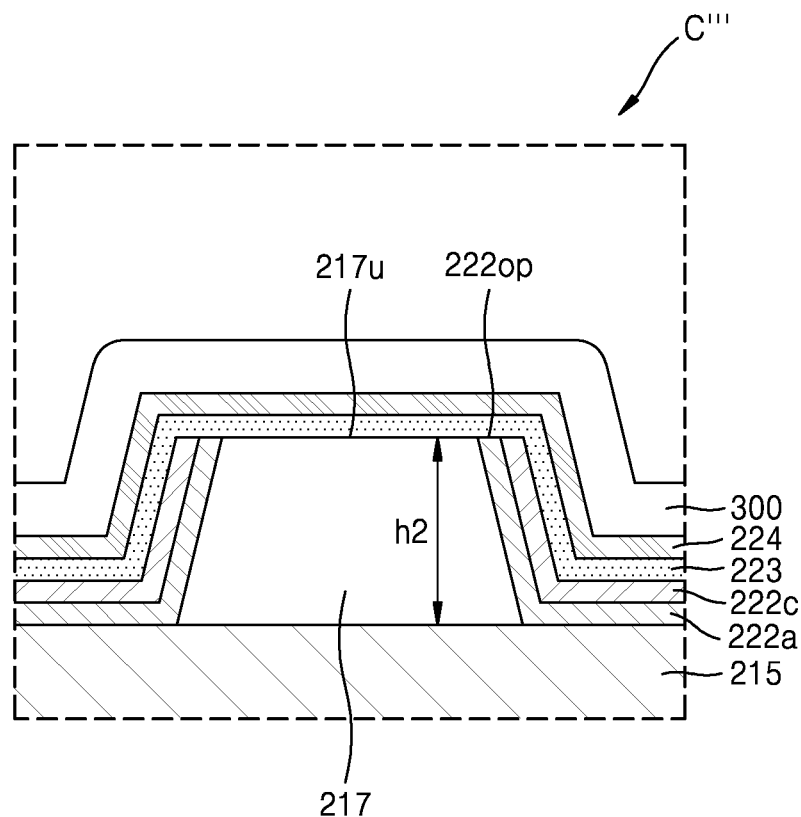

FIGS. 11 and 12 are cross-sectional views schematically illustrating a portion of a display apparatus according to some example embodiments. FIGS. 11 and 12 may correspond to a modification of the region C of FIG. 6.

Referring to the example C'' of FIG. 11, a recess portion 217r recessed toward the pixel definition layer 215, that is, toward the substrate 100, may be provided at the upper surface 217u of the spacer 217. The recess portion 217r may be understood as being formed by removing a portion of the spacer 217 together in the process of removing the particles Pc (see FIG. 15) over the spacer 217. A through hole 222op may be provided in the functional layers 222a and 222c to correspond to the recess portion 217r of the spacer 217. The opposite electrode 223 may cover the inner surface of the through hole 222op and the recess portion 217r over the spacer 217 and may directly contact the spacer 217.

An example C''' of FIG. 12 may be similar to the example C'' of FIG. 11 but may be different therefrom in that an upper portion of the spacer 217 is entirely removed instead of the recess portion 217r being formed in the spacer 217. When the particles Pc (see FIG. 15) over the spacer 217 are formed to have a width equal to or greater than the width of the upper surface 217u of the spacer 217, a laser should be irradiated with a width equal to or greater than the width of the spacer 217, and in this case, a portion or all of the spacer 217 may be removed. Thus, a height h2 of the spacer 217 illustrated in FIG. 12 may be smaller than a height h1 of the spacer 217 in the above embodiments, for example, in the example embodiments described with respect to FIG. 9.

The functional layers 222a and 222c may be entirely removed from the upper surface 217u of the spacer 217, and a cut surface forming the through hole 222op of the functional layers 222a and 222c may be located in the same plane as the upper surface 217u of the spacer 217. The opposite electrode 223 may directly contact the upper surface 217u of the spacer 217.

Figure 13:
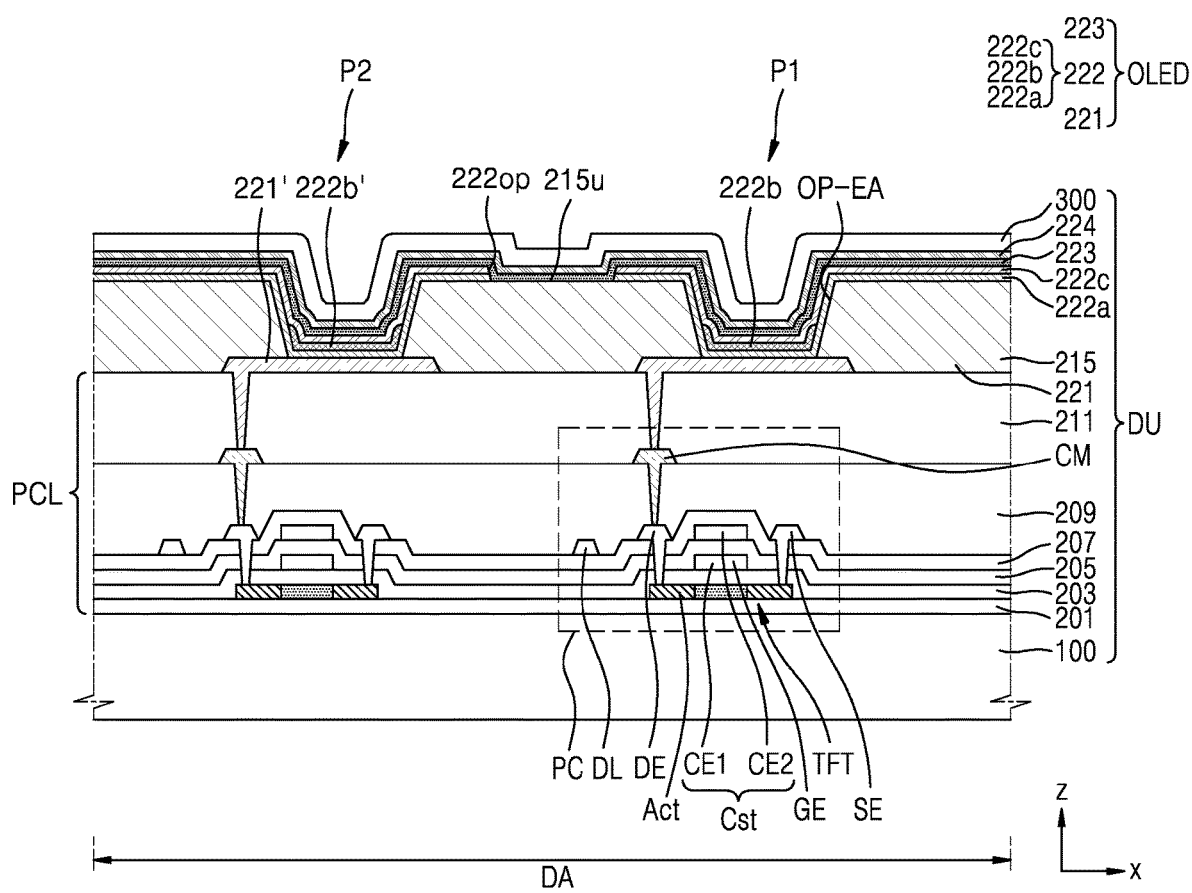
FIGS. 13 and 14 are cross-sectional views schematically illustrating a portion of a display apparatus according to some example embodiments.
Figure 14:
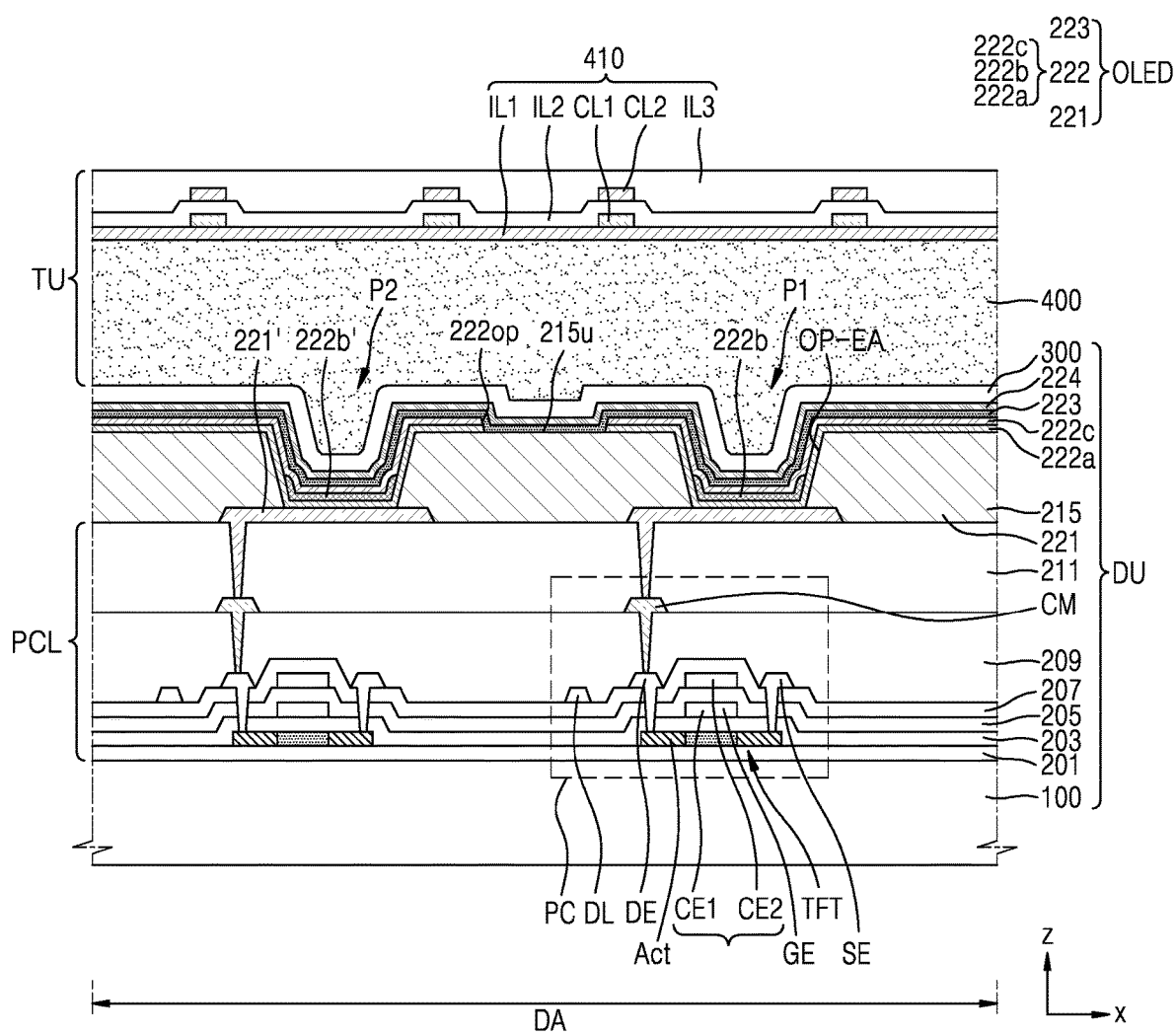

FIGS. 13 and 14 are cross-sectional views schematically illustrating a portion of a display apparatus according to some example embodiments.

As compared with FIG. 6, the embodiments described with respect to FIG. 13 may be different from the above embodiments in that the spacer 217 is completely removed. The other structures except the removal of the spacer 217 may be the same as those of FIG. 6 described above, and thus, differences therebetween will be mainly described below.

A first pixel P1 and a second pixel P2 may be arranged over a substrate 100, and the first pixel P1 and the second pixel P2 may respectively include a first pixel electrode 221 and a second pixel electrode 221' that are spaced apart from each other. A pixel definition layer 215 may include an opening OP-EA exposing a central portion of the first pixel electrode 221 and the second pixel electrode 221'. An intermediate layer 222 may be arranged over the first pixel electrode 221 and the second pixel electrode 221'. A first functional layer 222a and a second functional layer 222c other than emission layers 222b and 222b' in the intermediate layer 222 may be integrally formed over the entire surface of the display area DA to cover the pixel definition layer 215.

Corresponding thereto over the pixel definition layer 215 corresponding to a space between the first pixel electrode 221 and the second pixel electrode 221', the functional layers 222a and 222c may include a through hole 222op. That is, at least a portion of the functional layers 222a and 222c may be removed corresponding thereto over the pixel definition layer 215. The through hole 222op of the functional layers 222a and 222c may be a portion where the spacer 217 of FIG. 6 is located.

As described above, the structure illustrated in FIG. 13 may be derived by removing all of the spacers 217 together in the process of removing the particles Pc formed over the spacer 217.

Because the opposite electrode 223 is formed after the spacer 217 is removed, at least a portion of the opposite electrode 223 may directly contact the upper surface 215u of the pixel definition layer 215 exposed through the through hole 222op.

FIG. 14 illustrates a structure in which an input sensing layer TU is further arranged over a display layer DU of FIG. 13. In FIG. 14, the embodiments described with respect to FIG. 13 is illustrated as the display layer DU; however, in FIG. 14, the display layer DU of the above embodiments may also be applied as the display layer DU.

Referring to FIG. 14, an input sensing layer TU may be arranged over the display layer DU. The input sensing layer TU may be directly arranged over an inorganic encapsulation layer 300. According to some example embodiments, the input sensing layer TU may include an organic planarization layer 400, a first insulating layer IL1, a first conductive layer CL1, a second insulating layer IL2, a second conductive layer CL2, and a third insulating layer IL3. The first conductive layer CL1 and the second conductive layer CL2 may electrically contact each other to form a sensing electrode.

The organic planarization layer 400 may be directly arranged over the inorganic encapsulation layer 300. The organic planarization layer 400 may function to planarize the upper surface of the display layer DU such that a touch layer 410 of the input sensing layer TU may be arranged over a planarized surface thereof.

Because the display apparatus 1 according to some example embodiments includes an inorganic encapsulation layer 300 including only an inorganic layer as a thin film encapsulation layer TFE (see FIG. 2), when the touch layer 410 is directly arranged over the inorganic encapsulation layer 300, a defect may occur due to the non-planarization of the upper surface of the display layer DU. Thus, the organic planarization layer 400 may be arranged between the inorganic encapsulation layer 300 and the touch layer 410 such that the touch layer 410 may be arranged over a planarized surface thereof.

Although only the display apparatus has been mainly described above, embodiments according to the present disclosure are not limited thereto. For example, a method of manufacturing the display apparatus will also be within the scope of embodiments according to the present disclosure.

Figure 15:
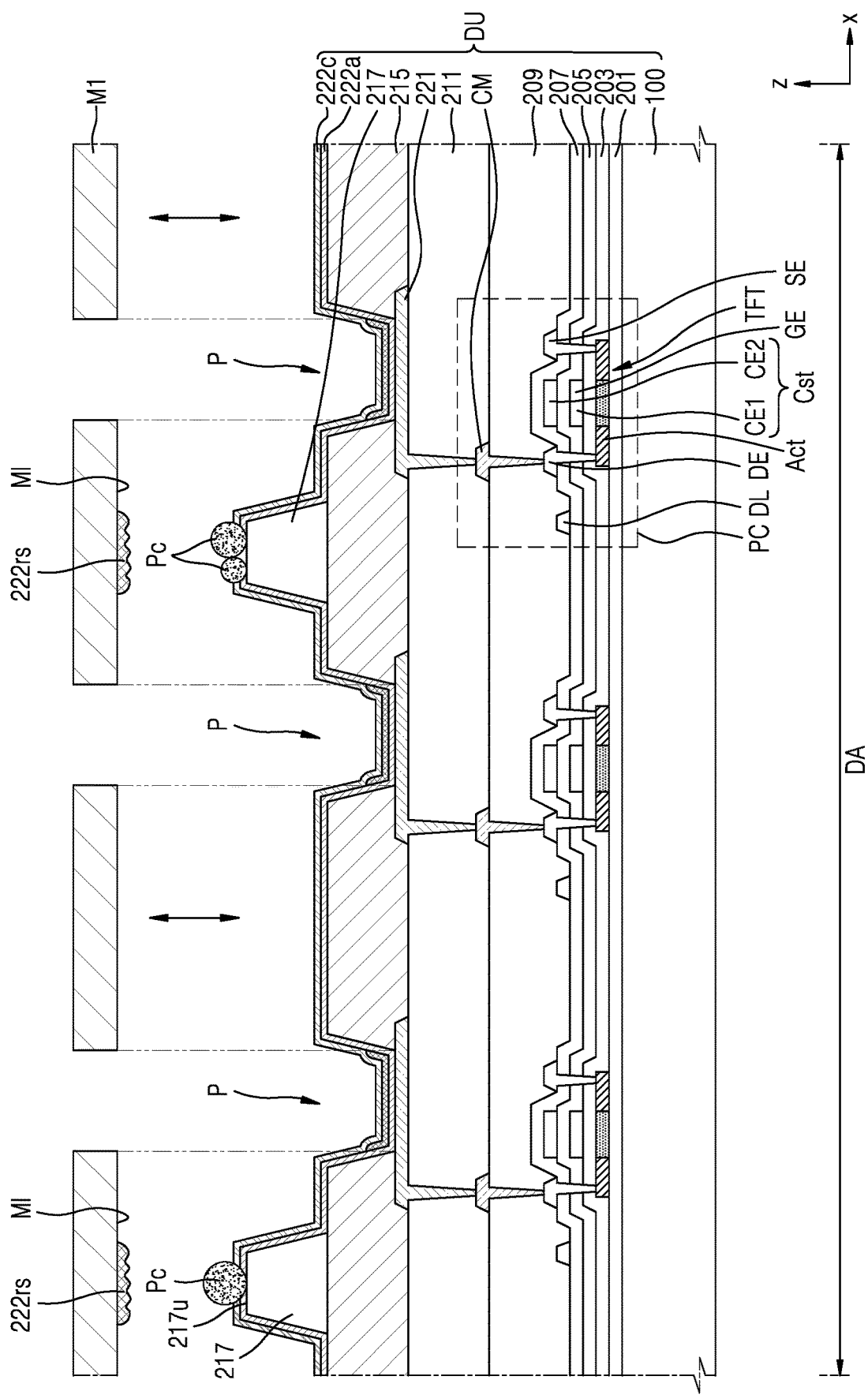
FIGS. 15 to 17 are cross-sectional views schematically illustrating a portion of a method of manufacturing a display apparatus according to some example embodiments.
Figure 16:
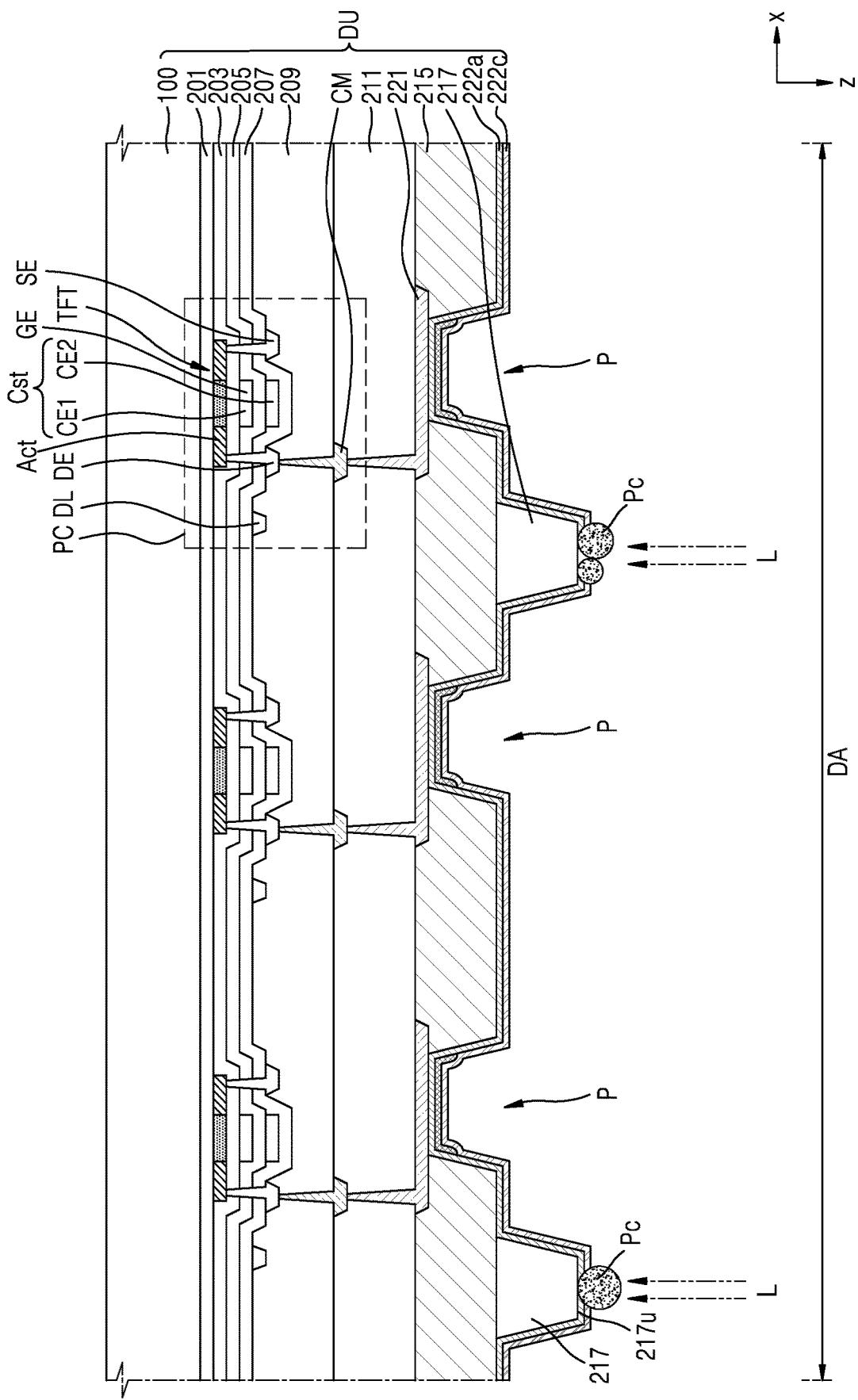
Figure 17:
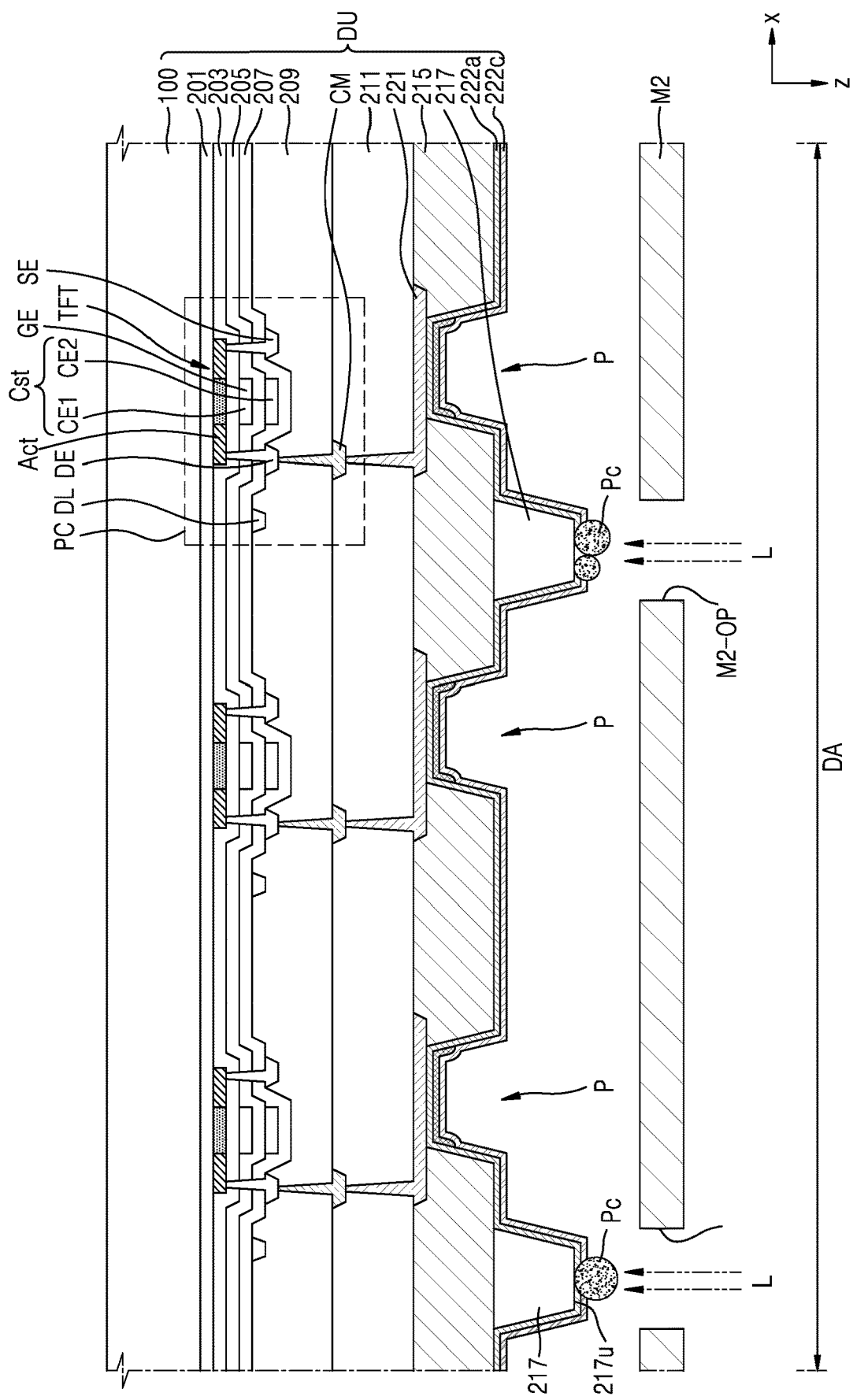

FIGS. 15 to 17 are cross-sectional views schematically illustrating a portion of a method of manufacturing a display apparatus according to some example embodiments.

Referring to FIG. 15, various layers and conductive patterns for forming a display layer DU may be arranged over a substrate 100. In this regard, because the layers stacked in the upward direction (e.g., +z direction) with respect to the substrate 100 has been sequentially described in FIG. 6 described above and the manufacturing process thereof is also formed in the order described in FIG. 6, a description of a process of manufacturing the display layer DU will be replaced with the description of FIG. 6.

Moreover, as illustrated in FIG. 15, a pixel electrode 221 and a pixel definition layer 215 may be formed and then an intermediate layer 222 (see FIG. 6) may be formed over the pixel electrode 221 and the pixel definition layer 215. For this purpose, a first functional layer 222a, an emission layer 222b, and a second functional layer 222c may be sequentially formed. The first functional layer 222a and the second functional layer 222c may be commonly arranged over the entire surface of the display area DA and may be formed by using, for example, an open mask. On the other hand, because the emission layer 222b should be patterned and formed for each pixel P, the emission layer 222b may be formed by using a first mask M1 with an opening formed corresponding to each pixel P. For example, the first mask M1 may be a fine metal mask (FMM).

The first mask M1 may prevent or reduce the sag of the first mask M1 by directly contacting the upper surface 217u of the spacer 217 while forming the emission layer 222b. Thereafter, as illustrated in FIG. 15, the first mask M1 may be separated from the display layer DU. In this process, a portion of the first functional layer 222a and the second functional layer 222c formed at the upper surface 217u of the spacer 217 may remain as a residue 222rs at a rear surface MI of the first mask M1 directly contacting the upper surface 217u of the spacer 217. Simultaneously (or concurrently), impurities such as particles Pc may occur at the upper surface 217u of the spacer 217 directly contacting the first mask M1, in the process where a portion of the first functional layer 222a and the second functional layer 222c is stripped out. The particles Pc may flow into the emission area of the pixel P in a subsequent process, thus causing a defect in the light emission quality of the pixel P. Also, when the particles Pc continue to remain at the upper surface 217u of the spacer 217, because the step coverage of the inorganic encapsulation layer 300 arranged over the spacer 217 may be destabilized, the probability of occurrence of a crack therein may increase, thus leading to poor encapsulation characteristics.

Thus, in the method of manufacturing the display apparatus according to some example embodiments, by removing the particles Pc formed over the spacer 217 before forming the opposite electrode 223 by using a laser L as illustrated in FIG. 16 or 17, a defect rate due to the particles Pc that are impurities formed in the manufacturing process may be minimized.

Before removing the particles Pc by using the laser L in FIG. 16 or 17, the substrate 100 may be inverted (upside down) such that the rear surface of the substrate 100 may face in the upward direction (e.g., +z direction). Accordingly, the intermediate layer 222 may be arranged to face in the ground direction or the gravity direction (e.g., −z direction, or a direction perpendicular or normal with respect to the display surface that moves toward the display surface, opposite the upward direction).

Referring to FIG. 16, a laser L may be irradiated toward the particles Pc with the substrate 100 inverted. For example, a beam laser, a spot laser, or the like may be used as the laser L, and a laser in various wavelength bands from infrared (IR) to ultraviolet (UV) may be used. Also, for example, a portion removed by the laser L may be variously modified, such as entirely removed through etching or partially removed through ablation.

The particles Pc of a portion irradiated with the laser L may be dropped by gravity in the ground direction (e.g., −z direction). In this way, by performing a laser (L) process with the substrate 100 inverted, the dropped particles Pc may naturally fall in the gravity direction and contamination of the display layer DU by the dropped particles Pc may be prevented or reduced. According to some example embodiments, by arranging a separate particle (Pc) collector under the substrate 100, it may be possible to prevent or reduce contamination of the inside of the chamber by the dropped particles Pc.

Various structures corresponding to FIGS. 6 to 14 described above may be implemented according to the degree of irradiation of the laser during the laser (L) process. According to some example embodiments, a structure illustrated in FIGS. 6 to 9 may be formed when only the upper particles Pc are removed without removing the spacer 217 when removing the particles Pc. In other embodiments, a structure illustrated in FIGS. 12 to 14 may be formed when all or a portion of the spacer 217 is removed together when removing the particles Pc.

In the case of FIG. 16, because the laser L should be irradiated targeting the particles Pc, a spot laser or the like may be used as the laser L.

In other embodiments, as illustrated in FIG. 17, a second mask M2 may be arranged to face the substrate 100, and a laser L may be commonly irradiated onto a plurality of spacers 217 arranged over the display area DA, through a through portion M2-OP formed in the second mask M2. The through portion M2-OP formed in the second mask M2 may be patterned to correspond to the spacer 217.

As in FIG. 4 described above, a plurality of spacers 217 may be arranged over the display area DA and may be spaced at certain intervals to have a certain rule. Thus, when the second mask M2 includes a through portion M2-OP corresponding to each spacer 217 and a laser L is irradiated onto the entire surface of the substrate 100 with the second mask M2 therebetween, the laser L may be irradiated only onto the spacer 217 through the through portion M2-OP to collectively remove the particles Pc formed over the plurality of spacers 217 to reduce the process time thereof.

After the particles Pc over the spacer 217 are removed as in FIG. 16 or 17, an opposite electrode 223 may be formed over the intermediate layer 222 as in FIG. 6 or 13. The opposite electrode 223 may be formed over the entire surface of the display area DA of the substrate 100. As in the above embodiments of FIGS. 6 to 14, the opposite electrode 223 may directly contact the spacer 217 or the pixel definition layer 215 at a portion where the particles Pc over the spacer 217 are removed.

Thereafter, an inorganic encapsulation layer 300 may be formed over the opposite electrode 223 as in FIG. 6 or 13. The inorganic encapsulation layer 300 may be formed by, for example, chemical vapor deposition (CVD). In the display apparatus 1 according to some example embodiments, a thin film encapsulation layer TFE formed only of the inorganic encapsulation layer 300 may be provided. As a comparative example, when a thin film encapsulation layer has a multilayer structure including at least one organic layer and at least one inorganic layer, the process equipment of the display apparatus may increase, the material cost may increase, and the thickness of the display apparatus itself may increase, thus causing a degradation in flexibility. Thus, in the display apparatus 1 according to some example embodiments, by providing a thin film encapsulation layer TFE formed only of the inorganic encapsulation layer 300, the process condition thereof may be simplified and the thickness of the display apparatus may be reduced and thus the display apparatus with improved flexibility may be implemented.

As described above, according to some example embodiments, a display apparatus having enhanced encapsulation characteristics while having a small thickness and a method of manufacturing the same may be implemented. However, the scope of embodiments according to the present disclosure are not limited to these effects.

It should be understood that aspects of example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a first pixel electrode and a second pixel electrode spaced apart from each other on a substrate;
   a pixel definition layer including an opening exposing a central portion of each of the first pixel electrode and the second pixel electrode;
   an intermediate layer on the first pixel electrode, the second pixel electrode, and the pixel definition layer, the intermediate layer including an emission layer in the opening of the pixel definition layer, a first functional layer under the emission layer, and a second functional layer above the emission layer, wherein the first functional layer includes at least one of a hole transport layer or a hole injection layer, and the second functional layer includes at least one of an electron transport layer or an electron injection layer, and the intermediate layer has a through hole penetrating through an entire thickness of the intermediate layer between the first pixel electrode and the second pixel electrode to expose side surfaces of the first functional layer and the second functional layer that face the through hole;
   a spacer entirely above the pixel definition layer, with the through hole of the intermediate layer being above the spacer and the through hole positioned to overlap with an upper surface of the pixel definition layer and an upper surface of the spacer;
   an opposite electrode on the intermediate layer to face the first pixel electrode and the second pixel electrode; and
   an inorganic encapsulation layer over the opposite electrode,
   wherein, in a plan view, the intermediate layer is not located between the side surfaces of the intermediate layer that face the through hole, and
   wherein the opposite electrode directly contacts the exposed side surfaces of the first functional layer and the second functional layer in the through hole.

2. The display apparatus of claim 1, wherein the opposite electrode directly contacts the upper surface of the pixel definition layer through the through hole.

3. The display apparatus of claim 1, wherein the spacer is between the pixel definition layer and the opposite electrode to correspond to a space between the first pixel electrode and the second pixel electrode.

4. The display apparatus of claim 3, wherein the intermediate layer is not arranged over an upper surface of the spacer.

5. The display apparatus of claim 4, wherein the opposite electrode directly contacts the upper surface of the spacer through the through hole.

6. The display apparatus of claim 3, wherein the spacer includes a recess portion in which a portion of an upper surface of the spacer is recessed toward the substrate.

7. The display apparatus of claim 6, wherein the opposite electrode directly contacts an inner surface of the recess portion.

8. The display apparatus of claim 1, wherein a thickness of the inorganic encapsulation layer is 2,000 Å to 2 μm.

9. The display apparatus of claim 8, wherein the inorganic encapsulation layer includes a multilayer structure of at least two layers.

10. The display apparatus of claim 9, wherein the inorganic encapsulation layer includes a first layer and a second layer sequentially stacked, and the first layer and the second layer include a same material but have different composition ratios.

11. The display apparatus of claim 10, wherein a thicknesses of each of the first layer and the second layer is 500 Å to 5,000 Å.

12. The display apparatus of claim 1, further comprising an input sensing layer on the inorganic encapsulation layer, wherein the input sensing layer includes:
    an organic planarization layer on the inorganic encapsulation layer;
    an inorganic insulating layer on the organic planarization layer; and
    a sensing electrode on the inorganic insulating layer.

13. The display apparatus of claim 12, wherein the organic planarization layer is directly between the inorganic encapsulation layer and the inorganic insulating layer.

14. A display apparatus comprising:
    a first pixel electrode and a second pixel electrode spaced apart from each other over a substrate;
    a pixel definition layer including an opening exposing a central portion of each of the first pixel electrode and the second pixel electrode;
    a spacer on and entirely above the pixel definition layer to correspond to a space between the first pixel electrode and the second pixel electrode;
    an intermediate layer on the first pixel electrode, the second pixel electrode, and the spacer, the intermediate layer including an emission layer in the opening of the pixel definition layer, a first functional layer under the emission layer, and a second functional layer above the emission layer, the first functional layer including at least one of a hole transport layer or a hole injection layer, the second functional layer including at least one of an electron transport layer or an electron injection layer, and the intermediate layer extending continuously to cover an entirety of the spacer, wherein a thickness of a first portion corresponding to the first functional layer and the second functional layer over the spacer is less than a thickness of a second portion corresponding to the first functional layer and the second functional layer over the first pixel electrode and the second pixel electrode;

an opposite electrode on the intermediate layer; and an inorganic encapsulation layer on the opposite electrode, wherein the opposite electrode directly contacts the first portion corresponding to the first functional layer and the second functional layer over the spacer, and wherein a portion of the intermediate layer is disposed on a side surface and an upper surface of the pixel definition layer and another portion of the intermediate layer is disposed on a side surface of the spacer.

15. The display apparatus of claim 14, wherein the intermediate layer includes:

a first emission layer and a second emission layer respectively arranged over the first pixel electrode and the second pixel electrode and spaced apart from each other;

a first functional layer between the first pixel electrode and the first emission layer and between the second pixel electrode and the second emission layer; and a second functional layer between the first emission layer, the second emission layer, and the opposite electrode, wherein a thickness of the second functional layer corresponding to the first portion is less than a thickness of the second functional layer corresponding to the second portion.

16. The display apparatus of claim 14, wherein the intermediate layer includes:

a first emission layer and a second emission layer respectively on the first pixel electrode and the second pixel electrode and spaced apart from each other;

a first functional layer between the first pixel electrode and the first emission layer and between the second pixel electrode and the second emission layer; and a second functional layer between the first emission layer, the second emission layer, and the opposite electrode, wherein a thickness of the first functional layer corresponding to the first portion is less than a thickness of the second functional layer corresponding to the second portion.

17. The display apparatus of claim 16, wherein the second functional layer corresponding to the first portion is removed.

* * * * *